US006236696B1

(12) United States Patent
Aoki et al.

(10) Patent No.: US 6,236,696 B1
(45) Date of Patent: May 22, 2001

(54) DIGITAL PLL CIRCUIT

(75) Inventors: Yasushi Aoki, Tokyo; Masaki Satoh; Satoko Murakami, both of Kanagawa; Mitsuo Baba; Kiyoshi Mikami, both of Tokyo, all of (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/083,704

(22) Filed: May 22, 1998

(30) Foreign Application Priority Data

May 23, 1997 (JP) .................................................. 9-148458

(51) Int. Cl.[7] .................................................. H03D 3/24
(52) U.S. Cl. .......................... 375/376; 375/371; 375/362; 375/375
(58) Field of Search .................................. 375/215, 286, 375/328, 327, 394, 371, 373, 376, 375; 327/147, 156, 5, 17, 146, 162; 329/307, 325, 360, 361; 331/172

(56) References Cited

U.S. PATENT DOCUMENTS

| | | | | |
|---|---|---|---|---|
| 5,414,736 | * | 5/1995 | Hasegawa et al. ................... | 375/334 |
| 5,552,727 | * | 9/1996 | Nakao ................................... | 327/159 |
| 5,553,104 | * | 9/1996 | Takashi et al. ....................... | 375/373 |
| 5,557,648 | * | 9/1996 | Ishihara ................................ | 375/376 |
| 5,867,541 | * | 2/1999 | Tanaka et al. ....................... | 375/354 |
| 6,025,743 | * | 2/2000 | Abe ....................................... | 327/159 |
| 6,034,998 | * | 3/2000 | Takashi et al. ...................... | 375/294 |

FOREIGN PATENT DOCUMENTS

| | | |
|---|---|---|
| 7-41132 | 1/1995 | (JP) . |
| 8-237117 | 9/1996 | (JP) . |

\* cited by examiner

*Primary Examiner*—Chi Pham
*Assistant Examiner*—Emmanuel Bayard
(74) *Attorney, Agent, or Firm*—Scully, Scott, Murphy & Presser

(57) ABSTRACT

A digital PLL circuit includes a sampler which samples a burst data signal depending on N phase clock signals to produce N phase sampled data signals. Based on the N phase sampled data signals, an edge phase detector detects edge information and a duty detector detects duty information signals in synchronization with the reference signal. A selector selects an optimal sampled data signal from the N phase sampled data signals depending on the edge information and the duty information, and a retiming section retimes the sampled data signal selected in synchronization with the reference signal.

19 Claims, 24 Drawing Sheets

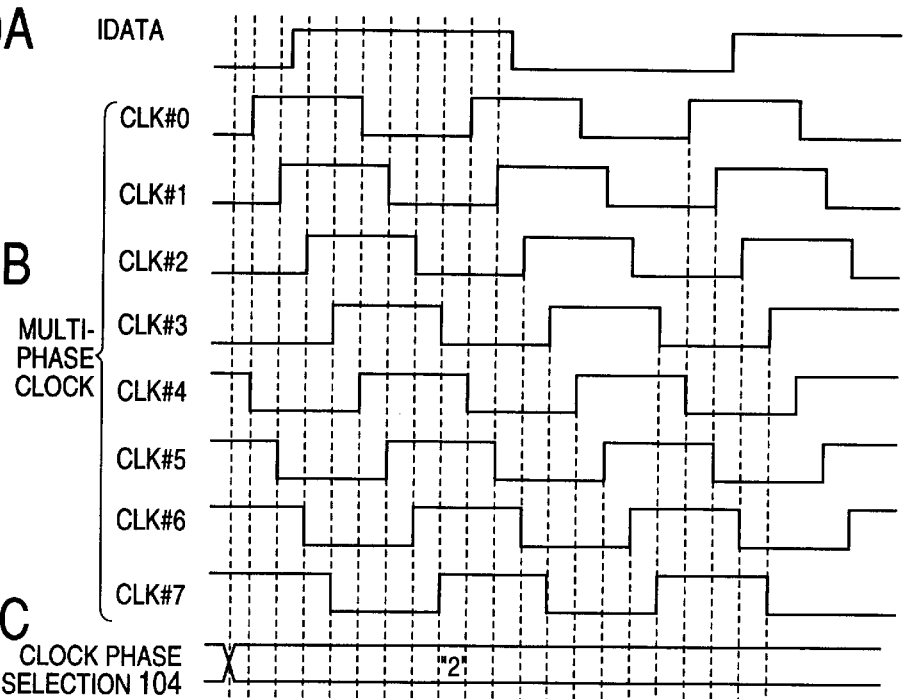
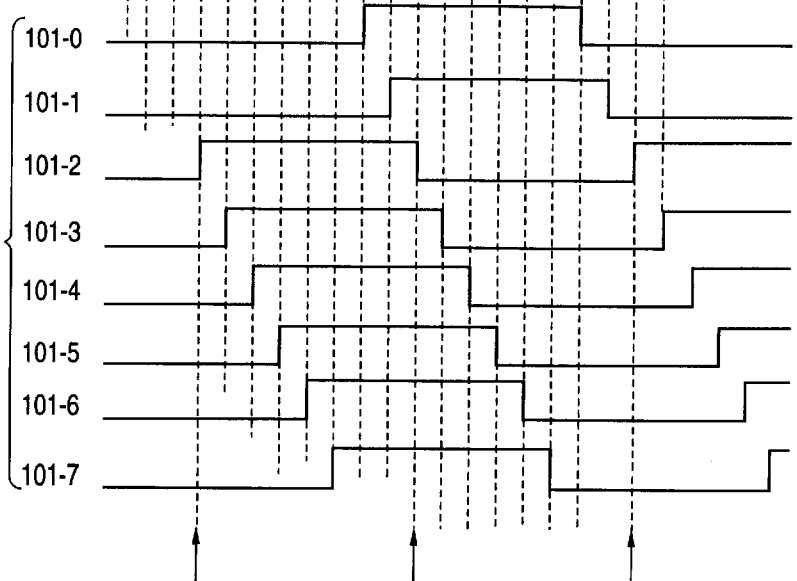
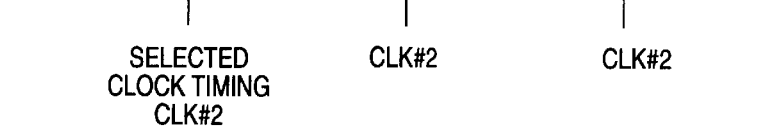

FIG. 11

LOGIC OF ENCODER OF FALLING-EDGE (RISING-EDGE) PHASE MEAN CALCULATOR 4(7)

| 103-0 (107-0) | 103-1 (107-1) | 103-2 (107-2) | 103-3 (107-3) | 103-4 (107-4) | 103-5 (107-5) | 103-6 (107-6) | S501-2 (S901-2) | S501-1 (S901-1) | S501-0 (S901-0) | S502 (S902) |
|---|---|---|---|---|---|---|---|---|---|---|
| 0 | X | X | X | X | X | X | 0 | 0 | 1 | 0 |
| 1 | 0 | X | X | X | X | X | 0 | 1 | 0 | 0 |
| 1 | 1 | 0 | X | X | X | X | 0 | 1 | 1 | 0 |
| 1 | 1 | 1 | 0 | X | X | X | 1 | 0 | 0 | 0 |
| 1 | 1 | 1 | 1 | 0 | X | X | 1 | 0 | 1 | 0 |
| 1 | 1 | 1 | 1 | 1 | 0 | X | 1 | 1 | 0 | 0 |
| 1 | 1 | 1 | 1 | 1 | 1 | 0 | 1 | 1 | 1 | 0 |
| 1 | 1 | 1 | 1 | 1 | 1 | 1 | 0 | 0 | 0 | 1 |

(X:DON'T CORE)

FIG. 12

LOGIC OF EDGE COUNTER OF FALLING-EDGE (RISING-EDGE) PHASE MEAN CALCULATOR 4(7)

| 111 | 106 (107) | S502 (S902) | S503 (PREVIOUS VALUE) (S903(PREVIOUS VALUE)) | S503 (S903) |
|---|---|---|---|---|
| 0 | X | X | X | 0 |
| 1 | ⎍ | 0 | X | PREVIOUS VALUE IS HELD |
| 1 | ⎍ | 1 | 0 | 1 |
| 1 | ⎍ | 1 | 1 | 2 |
| 1 | ⎍ | 1 | 2 | 3 |
| 1 | ⎍ | X | 3 | 3 |
| 1 | ⎍ | X | X | PREVIOUS VALUE IS HELD |

ROUND-OFF CONVERSION OF FALLING-EDGE (RISING-EDGE) PHASE MEAN CALCULATOR 4(7)

| S504-2 (S904-2) | S504-2 (S904-1) | S504-0 (S904-0) | S504-0.1 (S904-0.1) | 104-0 (108-0) | 104-1 (108-1) | 104-2 (108-2) | 104-3 (108-3) | 104-4 (108-4) | 104-5 (108-5) | 104-6 (108-6) | 104-7 (108-7) |
|---|---|---|---|---|---|---|---|---|---|---|---|
| 1 | 1 | 1 | 1 | 1 | 0 | 0 | 0 | 0 | 0 | 0 | 0 |
| 0 | 0 | 0 | 0 | 1 | 0 | 0 | 0 | 0 | 0 | 0 | 0 |
| 0 | 0 | 0 | 1 | 0 | 1 | 0 | 0 | 0 | 0 | 0 | 0 |
| 0 | 0 | 1 | 0 | 0 | 1 | 0 | 0 | 0 | 0 | 0 | 0 |
| 0 | 0 | 1 | 1 | 0 | 0 | 1 | 0 | 0 | 0 | 0 | 0 |
| 0 | 1 | 0 | 0 | 0 | 0 | 1 | 0 | 0 | 0 | 0 | 0 |
| 0 | 1 | 0 | 1 | 0 | 0 | 0 | 1 | 0 | 0 | 0 | 0 |
| 0 | 1 | 1 | 0 | 0 | 0 | 0 | 1 | 0 | 0 | 0 | 0 |
| 0 | 1 | 1 | 1 | 0 | 0 | 0 | 0 | 1 | 0 | 0 | 0 |
| 1 | 0 | 0 | 0 | 0 | 0 | 0 | 0 | 1 | 0 | 0 | 0 |
| 1 | 0 | 0 | 1 | 0 | 0 | 0 | 0 | 0 | 1 | 0 | 0 |
| 1 | 0 | 1 | 0 | 0 | 0 | 0 | 0 | 0 | 1 | 0 | 0 |
| 1 | 0 | 1 | 1 | 0 | 0 | 0 | 0 | 0 | 0 | 1 | 0 |
| 1 | 1 | 0 | 0 | 0 | 0 | 0 | 0 | 0 | 0 | 1 | 0 |
| 1 | 1 | 0 | 1 | 0 | 0 | 0 | 0 | 0 | 0 | 0 | 1 |
| 1 | 1 | 1 | 0 | 0 | 0 | 0 | 0 | 0 | 0 | 0 | 1 |

REFERENCE CLOCK (SELECTED CLOCK)
IDATA-1 (DUTY RATIO=100%)
IDATA-2 (DUTY RATIO<100%)
IDATA-3 (DUTY RATIO>100%)

FIG. 15

LOGIC OF DATA COUNTER OF DUTY JUDGING CIRCUIT 8

| 111 | 106 | INTERNAL COUNTER (PREVIOUS VALUE) | INTERNAL COUNTER | S1101 |
|---|---|---|---|---|
| 0 | X | X | 0 | 0 |
| 1 | ⌐╯ | LESS THAN 3 | PREVIOUS VALUE +1 | 0 |
| 1 | ⌐╯ | 3 | 4 | 1 |
| 1 | ⌐╯ | 4 | 4 | 0 |

FIG. 16A SELECTED CLOCK (106)
FIG. 16B IDATA-1 "0"
FIG. 16C IDATA-2 "1"
FIG. 16D IDATA-3
FIG. 16E IDATA-4
FIG. 16F IDATA-5

LOGIC OF EDGE COUNTER 1302

| SAMPLED DATA 102 | S 1302 |
|---|---|
| C EDGE=0 | 0 |
| C EDGE (FALLING)=1 | 1 |
| C EDGE (RISING)=1 | 2 |
| C EDGE=2 | 3 |

FIG. 18

LOGIC OF EDGE DECODER 1303

| | RISING AND FALLING EDGES FOR A PERIOD OF SELECTED CLOCK | | | | | | | | CLOCK-PHASE SELECTION | | | | | | | |
|---|---|---|---|---|---|---|---|---|---|---|---|---|---|---|---|---|
| 103-0 | 103-1 | 103-2 | 103-3 | 103-4 | 103-5 | 103-6 | 103-6 | S1303-0 | S1303-1 | S1303-2 | S1303-3 | S1303-4 | S1303-5 | S1303-6 | S1303-7 |
| 1 | 0 | X | X | X | X | X | X | 1 | 0 | 0 | 0 | 0 | 0 | 0 | 0 |
| 0 | 1 | X | X | X | X | X | X | 1 | 0 | 0 | 0 | 0 | 0 | 0 | 0 |
| 1 | 1 | 0 | X | X | X | X | X | 0 | 1 | 0 | 0 | 0 | 0 | 0 | 0 |
| 0 | 0 | 1 | X | X | X | X | X | 0 | 1 | 0 | 0 | 0 | 0 | 0 | 0 |
| 1 | 1 | 1 | 0 | X | X | X | X | 0 | 0 | 1 | 0 | 0 | 0 | 0 | 0 |
| 0 | 0 | 0 | 1 | X | X | X | X | 0 | 0 | 1 | 0 | 0 | 0 | 0 | 0 |
| 1 | 1 | 1 | 1 | 0 | X | X | X | 0 | 0 | 0 | 1 | 0 | 0 | 0 | 0 |
| 0 | 0 | 0 | 0 | 1 | X | X | X | 0 | 0 | 0 | 1 | 0 | 0 | 0 | 0 |
| 1 | 1 | 1 | 1 | 1 | 0 | X | X | 0 | 0 | 0 | 0 | 1 | 0 | 0 | 0 |
| 0 | 0 | 0 | 0 | 0 | 1 | X | X | 0 | 0 | 0 | 0 | 1 | 0 | 0 | 0 |
| 1 | 1 | 1 | 1 | 1 | 1 | 0 | X | 0 | 0 | 0 | 0 | 0 | 1 | 0 | 0 |
| 0 | 0 | 0 | 0 | 0 | 0 | 1 | X | 0 | 0 | 0 | 0 | 0 | 1 | 0 | 0 |
| 1 | 1 | 1 | 1 | 1 | 1 | 1 | 0 | 0 | 0 | 0 | 0 | 0 | 0 | 1 | 0 |
| 0 | 0 | 0 | 0 | 0 | 0 | 0 | 1 | 0 | 0 | 0 | 0 | 0 | 0 | 1 | 0 |
| 1 | 1 | 1 | 1 | 1 | 1 | 1 | 1 | 0 | 0 | 0 | 0 | 0 | 0 | 0 | 1 |
| 0 | 0 | 0 | 0 | 0 | 0 | 0 | 0 | 0 | 0 | 0 | 0 | 0 | 0 | 0 | 1 |

OPERATION OF RISING-EDGE RETIMING POSITION DETERMINING SECTION 1304

FIG. 20

LOGIC OF SELECT SIGNAL PRODUCING SECTION 1305

| S1302 | SELECT SIGNAL S1301 |
|---|---|
| 0 | 00001000 |
| 1 | 00001000 |
| 2 | S1304 |
| 3 | S1303 |

FIG. 21

DATA SELECTION OF SELECTOR 1306

| SELECT SIGNAL S1301 | SELECT DATA 110 |
|---|---|
| 10000000 | 102-0 |
| 01000000 | 102-1 |
| 00100000 | 102-2 |
| 00010000 | 102-3 |
| 00001000 | 102-4 |
| 00000100 | 102-5 |
| 00000010 | 102-6 |
| 00000001 | 102-7 |

LOGIC OF ENCODERS 1904-1907

S1902: INPUT OF ENCODER 1904
S1903: INPUT OF ENCODER 1906
S1904: INPUT OF ENCODER 1905
S1905: INPUT OF ENCODER 1907

S1906: OUTPUT OF ENCODER 1904
S1907: OUTPUT OF ENCODER 1905
S1908: OUTPUT OF ENCODER 1906
S1909: OUTPUT OF ENCODER 1907

| S1902 S1903 S1904 S1905 | -0 | -1 | -2 | -3 | -4 | -5 | -6 | -7 | -8 | -9 | -10 | -11 | -12 | -13 | -14 | -15 |
|---|---|---|---|---|---|---|---|---|---|---|---|---|---|---|---|---|
| S1906 S1907 S1908 S1909 -0 | 1 | 0 | 1 | 0 | 1 | 0 | 1 | 0 | 1 | 0 | 1 | 0 | 1 | 0 | 1 | 0 |
| S1906 S1907 S1908 S1909 -1 | 0 | 1 | 1 | 0 | 0 | 1 | 1 | 0 | 0 | 1 | 1 | 0 | 0 | 1 | 1 | — |
| S1906 S1907 S1908 S1909 -2 | 0 | 0 | 0 | 1 | 1 | 1 | 1 | 0 | 0 | 0 | 0 | 1 | 1 | 1 | 1 | — |
| S1906 S1907 S1908 S1909 -3 | 0 | 0 | 0 | 0 | 0 | 0 | 0 | 1 | 1 | 1 | 1 | 1 | 1 | 1 | 1 | — |

(Input/Output logic table; X = don't care, values 0/1 as shown)

DIGITAL PLL CIRCUIT

BACKGROUND OP THE INVENTION

1. Field of the Invention

The present invention relates to a digital PLL (phase-locked loop) circuit, and more particularly to a digital PLL circuit suitable for a receiver which receives a data signal in bursts including duty fluctuations and jitters.

2. Description of the Related Art

A typical PLL circuit uses a low-pass filter (LPF) to remove high frequency components from an error signal generated by a phase comparator. The oscillation frequency of a VCO (voltage-controlled oscillator) is controlled with the smoothed error signal to tune its output frequency to the input data. In the case where such a PLL circuit is applied to a burst-like digital data signal varying in phase due to frequency deviation, duty fluctuation, a jitter and so forth, the PLL circuit needs a long phase tuning time and further brings about errors when retiming the received data on the basis of a separate clock.

To solve the above problem, Baba, one of the present inventors, Invented a new digital PLL circuit and made a Japanese patent application on Mar. 1. 1995 (Japanese Patent Application No. 7-41132). The United States Patent was obtained for the same (U.S. Pat. No. 5,687,203). The digital PLL circuit is provided with a data sampling circuit which samples input data in response to N phase clocks in the direction of (received) time. The phase of the clock corresponding to, among the sampled data, the data in which edges are evenly detected is used as a first phase or reference clock. The N phase sampled data signals are rearranged in synchronism with the first phase clock to thereby generate N phase rearranged data signals from which an optimal sampled data signal is selected. The digital PLL circuit can cope with frequency deviation, duty fluctuation, a jitter and so forth.

However, in the case of fluctuation or deviation of 50% or more, there may be cases where an identification point at which the input data is identified is erroneously determined, leading to an error when retiming the input data.

SUMMARY OF THE INVENTION

The present invention has been made to solve the above problems, and therefore an object of the present Invention is to provide a digital PLL circuit which can rapidly extract a timing clock from a burst-like digital data signal varying in phase due to frequency deviation, duty fluctuation, a jitter and so forth so as to identify the input data signal without any error.

In order to achieve the above object, according to the present invention, a digital PLL circuit is provided with a sampler for sampling a burst data signal depending on N phase clock signals to produce N phase sampled data signals. Based on the N phase sampled data signals, an edge phase detector detects edge information in synchronization with a reference signal. The digital PLL circuit is further provided with a duty detector for detecting duty information based on the N phase sampled data signals in synchronization with the reference signal. A selector selects an optimal sampled data signal from the N phase sampled data signals depending on the edge information and the duty information, and a retiming section retimes the sampled data signal selected in synchronization with the reference signal.

The above and other objects and features of the present invention will be more apparent from the following description taken in conjunction with the accompanying drawings.

BRIEF DESCRIPTION OF THE DRAWINGS

FIGS. 10A–10D are timing charts showing a specific operation of a sampling circuit and a phase comparator in the first embodiment;

FIG. 11 is a diagram showing the logic of encoder of falling-edge/rising-edge phase mean calculator in the first embodiment;

FIG. 12 is a diagram showing the logic of edge counter of falling-edge/rising-edge phase mean calculator in the first embodiment;

FIG. 15 is a diagram showing the logic of data counter of duty judging circuit in the first embodiment;

FIGS. 15A–16F are timing charts showing a specific operation of data selector In the first embodiment;

FIG. 18 is a diagram showing the logic of edge decoder of the data selector in the first embodiment;

FIG. 20 is a diagram showing the logic of select signal producing section of the data selector in the first embodiment;

FIG. 21 is a diagram showing data selection of the data selector in the first embodiment;

FIG. 23 is a diagram showing the operation of rising-edge retiming position determining section in the data selector of FIG. 22;

FIG. 26 is a diagram showing the logic of encoders of duty calculator in the second embodiment;

DESCRIPTION OF THE PREFERRED EMBODIMENTS

Now, a description will be given in more detail of preferred embodiments of the present invention with reference to the accompanying drawings.

FIRST EMBODIMENT

Figure 1:
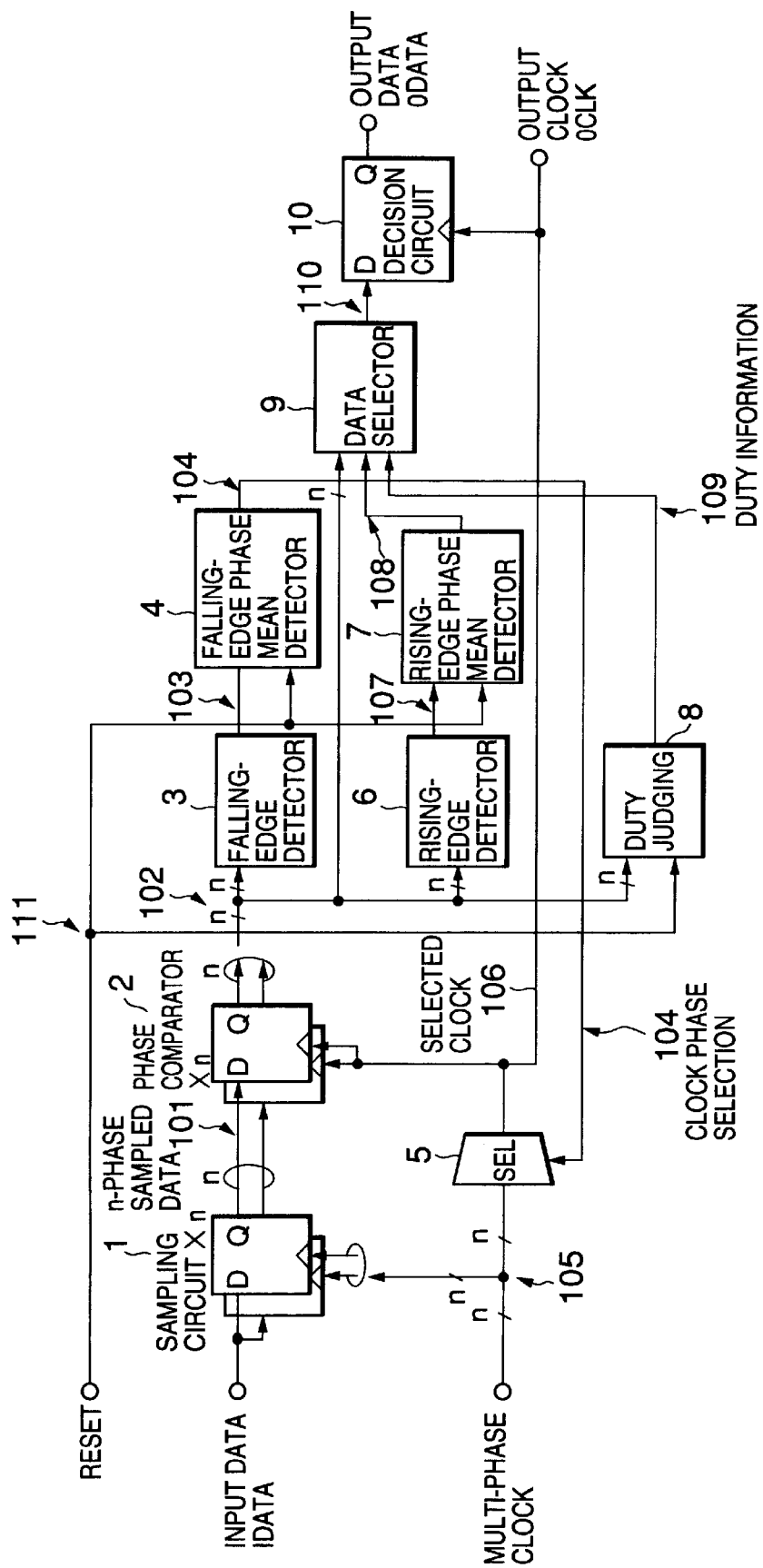
FIG. 1 is a schematic block diagram showing the a digital PLL circuit according to a first embodiment of the present invention.

Referring to FIG. 1, a digital PLL circuit according to the present invention is provided with a sampling section 1 and a phase comparing section 2. The sampling section 1 samples input data IDATA to output N phase sampled data 101 to the phase comparing section 2, where N is a 2 or more integer. The phase comparing section 2 outputs N phase sampled data 102 to a falling-edge detector 3 which detects falling edges from the N phase sampled data 102 and outputs falling-edge position data 103 to a falling-edge phase mean calculator 4. The falling-edge phase mean calculator 4 calculates a falling-edge mean phase value as a clock phase selection signal 104 and outputs it to an N:1 clock selector 5. The N:1 clock selector 5 selects a clock 106 from a multi-phase clock 105 and outputs it to the phase comparing section 2.

The phase comparing section 2 also outputs the N phase sampled data 102 to a rising-edge detector 6 which detects rising edges from the N phase sampled data 102 and outputs rising-edge position data 107 to a rising-edge phase mean calculator 7. The rising-edge phase mean calculator 7 calculates a rising-edge mean phase value 108. The phase comparing section 2 further outputs the N phase sampled data 102 to a duty judging circuit 8 which judges the duty ratio of the N phase sampled data 102 to produce duty information 109.

Based on the rising-edge mean phase value 108 and the duty information 109, a data selector 9 selects sampled data 110 from the N phase sampled data 102 and outputs the selected sampled data 110 to a decision circuit 10 which performs decision of the selected sampled data 110 depending on the selected clock 106 to produce output data ODATA.

The more detailed description of the digital PLL circuit will be made referring to FIG. 2. For simplicity, hereinafter assuming N=8

Figure 2:
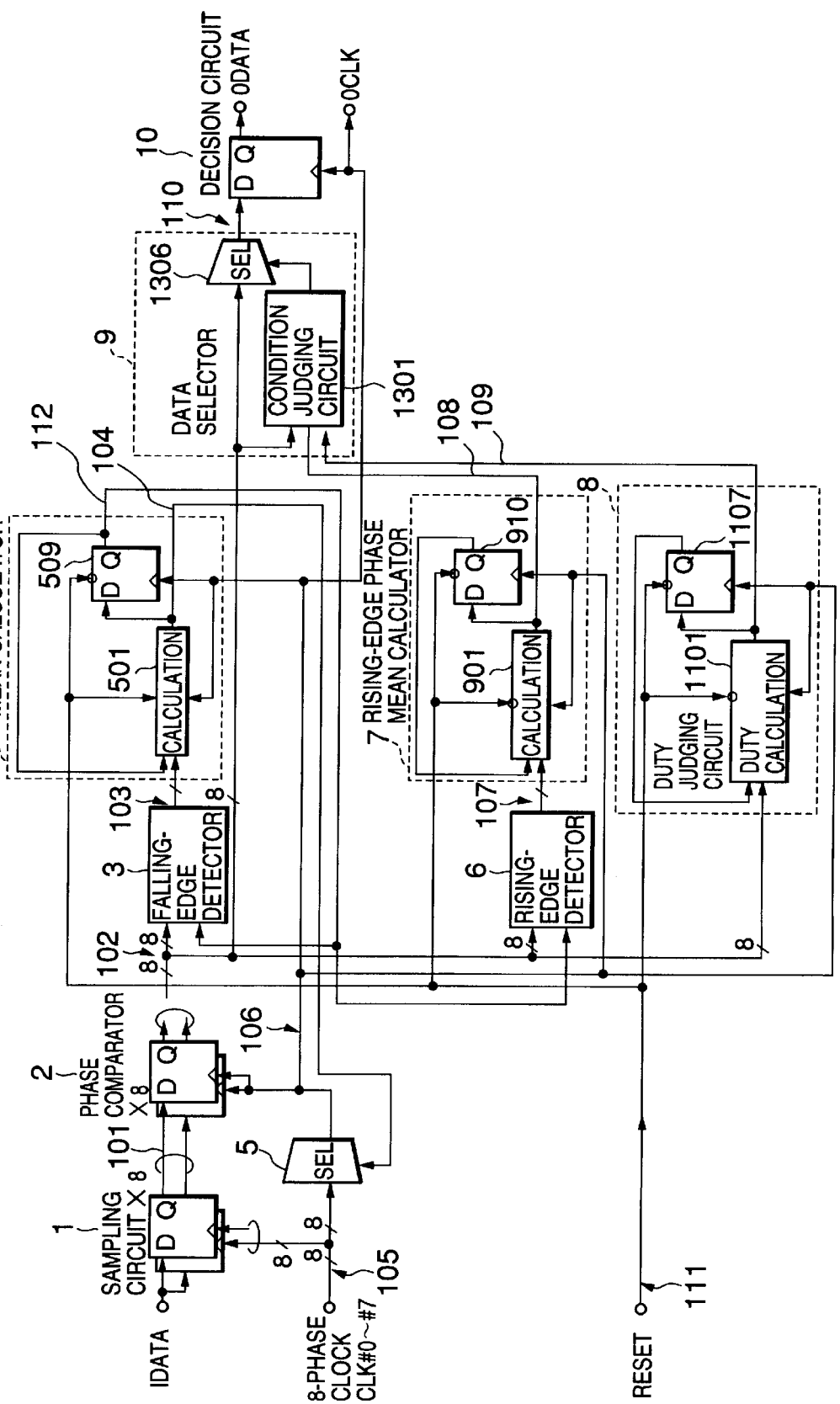
FIG. 2 is a diagram showing a specific configuration of the first embodiment.

As shown in FIG. 2, the sampling section 1 is composed of N (=8) sampling circuits, for example, flip-flop circuits which sample the input data IDATA to produce the N phase sampled data 101 using N phase clocks of the multi-phase clock signal 105, respectively. The N phase clocks are identical in frequency with the input data IDATA but the phases of the N phase clocks are sequentially shifted by 360 degrees/N (see FIGS. 10A and 10B).

A phase comparing section 2 is composed of N phase comparators, for example, flip-flop circuits which compare the N phase sampled data 101 with the clock 106 selected by the N:1 clock selector 5 as will be described later. In other words, the respective N phase comparators retime the N phase sampled data 101 in synchronization with the selected clock 106 to produce N phase sampled data 102 which are output to the falling-edge detector 3, the rising-edge detector 6, the duty judging circuit 8 and the data selector 9.

The falling-edge detector 3 and the rising-edge detector 6 are provided with a clock rotation circuit which may be shared between them. As will be described later, the clock rotation circuit regards the selected clock 106 as a first or reference phase clock and regards the other phase clocks as a second phase clock to N-th phase clock, respectively. The clock rotation circuit rearranges or rotates the N phase sampled data 102 in accordance with the first to N-th phase clocks to produce N phase rearranged data. In other words, the N phase rearranged data is retimed on the basis of the first phase or reference clock 106.

The falling-edge detector 3 detects falling edges from the N phase rearranged data and produces, every period, falling-edge position data 103 indicative of a difference between the N phase sampled data 102 and falling-edge mean phase data 112. The falling-edge position data 103 is output to the falling-edge phase mean calculator 4.

The falling-edge phase mean calculator 4, as will be described later, includes a calculation section 501 and a flip-flop circuit 509 which are used to calculate a falling-edge mean phase value of phase numbers from the past falling phase number to the present falling phase number. The falling-edge mean phase value is the phase number of a first or reference clock to be selected. In this case, the calculation section 501 outputs the falling-edge mean phase value as the clock phase selection signal 104 to the N:1 clock selector 5 and the flip-flop circuit 509 outputs a previous falling-edge mean phase value 112 to the falling-edge detector 3 and the rising-edge detector 6.

On the other hand, the rising-edge detector 6 detects rising edges from the N phase rearranged data and produces, every period, rising-edge position data 107 which is output to the rising-edge phase mean calculator 7.

The rising-edge phase mean calculator 7, as will be described later, includes a calculation section 901 and a flip-flop circuit 910 which are used to calculate a rising-edge mean phase value of phase numbers from the past falling phase number to the present falling phase number. The rising-edge mean phase value 108 is output from the calculation section 901 to the data selector 9.

The duty judging circuit 8 is composed of a duty calculatlon section 1101 and a flip-flop circuit 1107. The duty calculation section 1101 extracts a preamble from the N phase sampled data 102. The preamble includes alternating data "1" and "0" which is positioned at the head of the input burst data IDATA. The duty calculation section 1101 calculates the lengths of "1" and of "0" to produce a duty ratio of the input data IDATA as the duty information 109. The duty information 109 thus detected is held In the flip-flop circuit 1107 until a subsequent burst is received.

The data selector 9 includes a condition judging circuit 1301 and a selector 1306. The condition judging circuit 1301 judges the optimal phase suitable for data decision based on the N phase sampled data 102, the rising-edge mean phase value 108 and the duty information 109. The selector 1306 selects one phase sampled data of the N phase sampled data 102 depending on the judgement of the condition judging circuit 1301 to output the selected phase sampled data 110 to the decision circuit 10. The decision circuit 10 samples the selected phase sampled data 110 using the phase clock 106 selected by the N:1 clock selector 5 to produce the optimal output data ODATA.

A reset signal 111 is a timing signal indicating the beginning of the input data IDATA. The reset signal 111 resets the falling-edge phase mean calculator 4, the rising-edge phase mean calculator 7, and the duty judging circuit 8 to the initial state.

FALLING-EDGE DETECTOR

Figure 3:
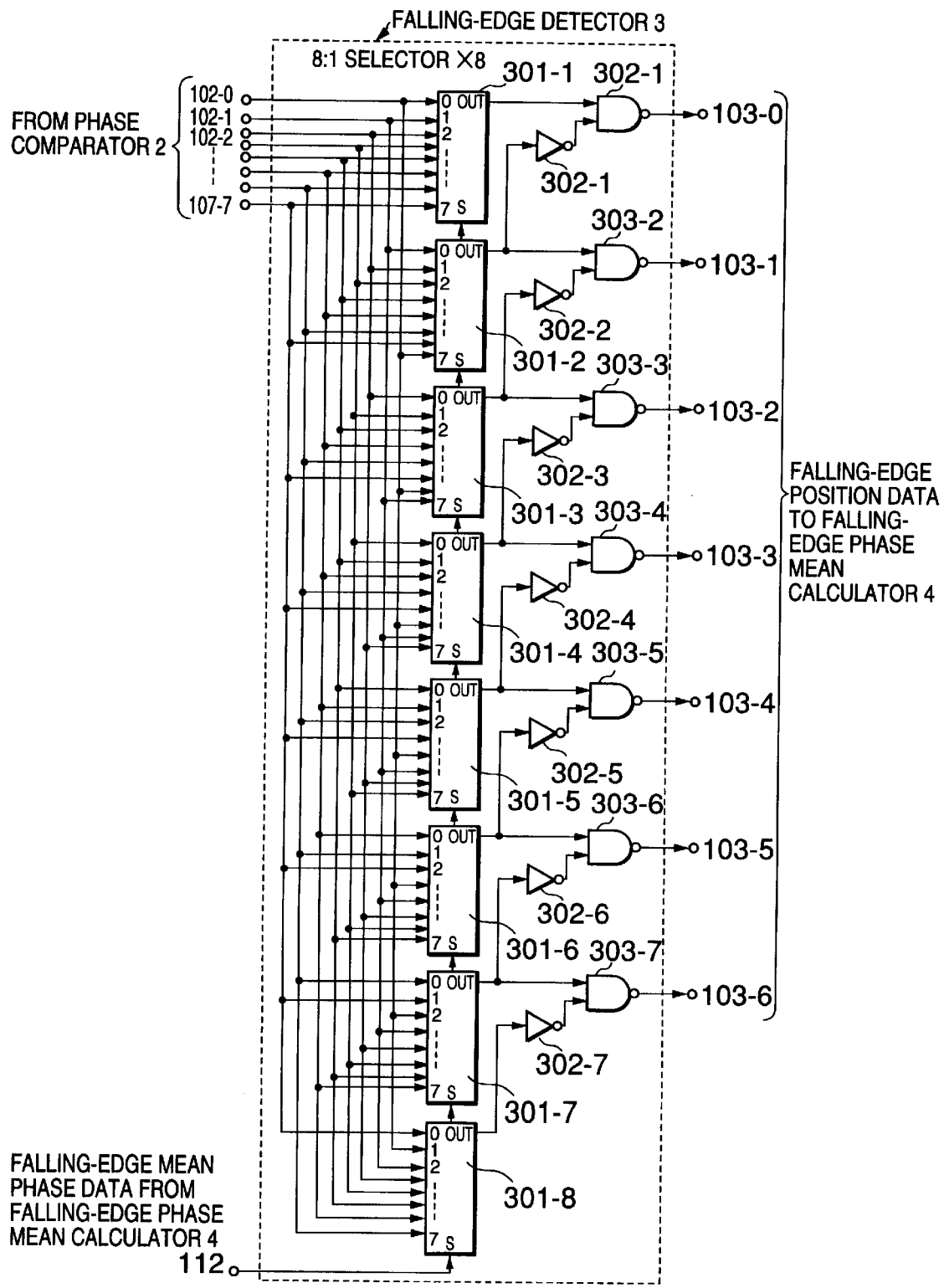
FIG. 3 is a diagram showing a circuit configuration of a falling-edge detector of the first embodiment.

Referring to FIG. 3, the falling-edge detector 3 is provided with the clock rotation circuit which is composed of eight 8:1 selectors 301-1 to 301-8. The respective 8:1 selectors 301-1 to 301-8 receive the 8 sampled data 102-0 to 102-7 in rotation based on previous falling-edge mean phase value 112 received from the falling-edge phase mean calculator 4. In such a circuit configuration, the clock rotation circuit rearranges or rotates the N phase sampled data 102-0 to 102-7 in accordance with the first to N-th phase clocks to produce the N phase rearranged data. In otherwords, the N phase sampled data 102-0 to 102-7 are retimed on the basis of the first phase or reference clock 106.

The falling-edge detector 3 is further provided with seven falling-edge detecting circuits each comprising an inverter and an NAND gate. For example, the first falling-edge detecting circuit is composed of an inverter 302-1 and an NAND gate 303-1. The inverter 302-1 inputs the output of the second 8:1 selector 301-2 and outputs the inverted one to an input of the NAND gate 303-1. The NAND gate 303-1 further inputs the output of the first 8:1 selector 301-1. Similarly, the inverters 302-2 to 302-7 and the NAND gates 303-2 to 303-7 are connected, respectively, and the falling-edge position data 103-0 to 103-6 are output from the NAND gates 303-1 to 303-7, respectively.

In this manner, the falling-edge detector 3 detects falling edges from the N phase rearranged data and outputs, every period, the falling-edge position data 103 indicative of a difference between the 8-phase sampled data 102 and the previous falling-edge mean phase data 112 to the falling-edge phase mean calculator 4.

FALLING-EDGE PHASE MEAN CALCULATOR

Figure 4:
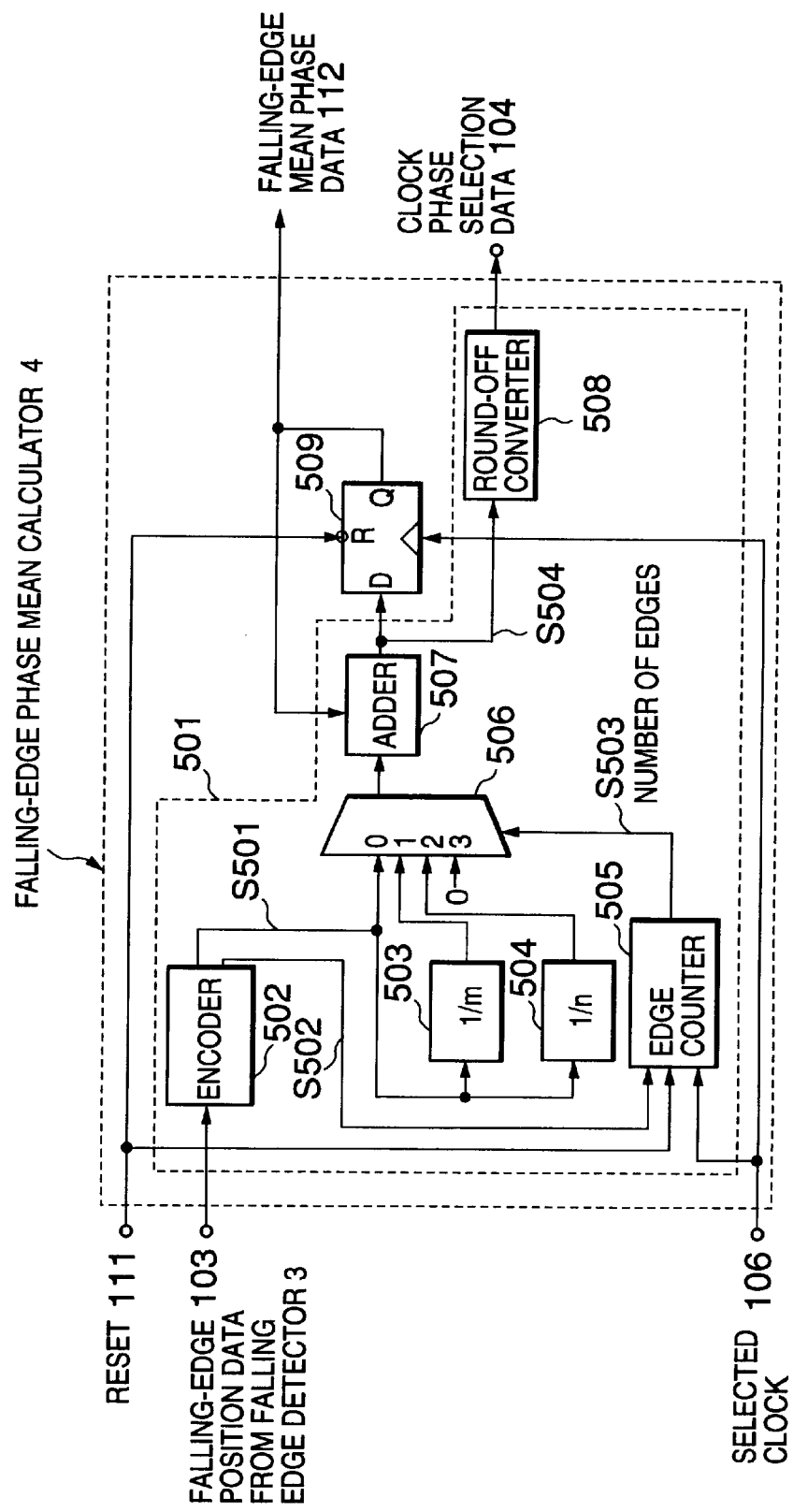
FIG. 4 is a diagram showing a circuit configuration of a falling-edge phase mean calculator in the first embodiment.

Referring to FIG. 4, the falling-edge phase mean calculator 4 includes the calculation section 501 and the flip-flop circuit 509. The calculation section 5011 is composed of an encoder 502 that inputs the falling-edge position data 103 from the falling-edge detector 3 and converts it into an appropriate form to produce falling-edge position data S501 and falling-edge presence/absence information S502 (see FIG. 11). The falling-edge position data S501 is output to a 1/m divider 503 and a 1/n divider 504, where m<n and m and n are an integer equal to or greater than 1. The 1/m divider 503 divides the falling-edge position data S501 by m and the 1/n divider 504 divides the falling edge information by n. In other words, the 1/m divider 503 weights the falling-edge position data S501 by 1/m and the 1/n divider 504 weights the falling-edge position data S501 by 1/n.

The falling-edge phase mean calculator 4 also includes an edge counter 505 which counts the number of falling edges based on the falling edge presence/absence information S502 according to the selected clock 106 (see FIG. 12). The edge counter 505 is reset according to the reset signal 111. The count value S503 is output to a selector 506 according to the selected clock 106.

The selector 506 receives the falling-edge position data S501, the 1/m-weighted falling-edge position data, the 1/n weighted falling-edge position data, and zero at four input terminals indicated by 0, 1, 2, and 3, respectively. The selector 506 selects one of them according to the count value S503 received from the edge counter 505. More specifically, at the beginning of the input data IDATA, the selector 506 selects the falling-edge position data S501. As the number falling edges increases, the weighting factor decreases sequentially in the order of 1, 1/m, 1/n, and zero.

A selected value is output to an adder 507. The adder 507 adds the selected value to the previous value stored in the flip-flop circuit 509 to produce the falling-edge mean phase value which in turn is stored onto the flip-flop circuit 509 according to the select clock 106. The flip-flop circuit 509 is reset by the reset signal 111. In this manner, the adder 507 and the flip-flop circuit 509 calculates the falling-edge mean phase value of phase numbers from the past falling phase number to the present falling phase number.

The falling-edge mean phase value from the adder 507 is output to a round-off converter 508. The round-off converter 508 rounds off the falling-edge mean phase value to produce the clock phase selection data 104 indicating the clock phase number to be selected (see FIG. 13).

RISING-EDGE DETECTOR

Figure 5:
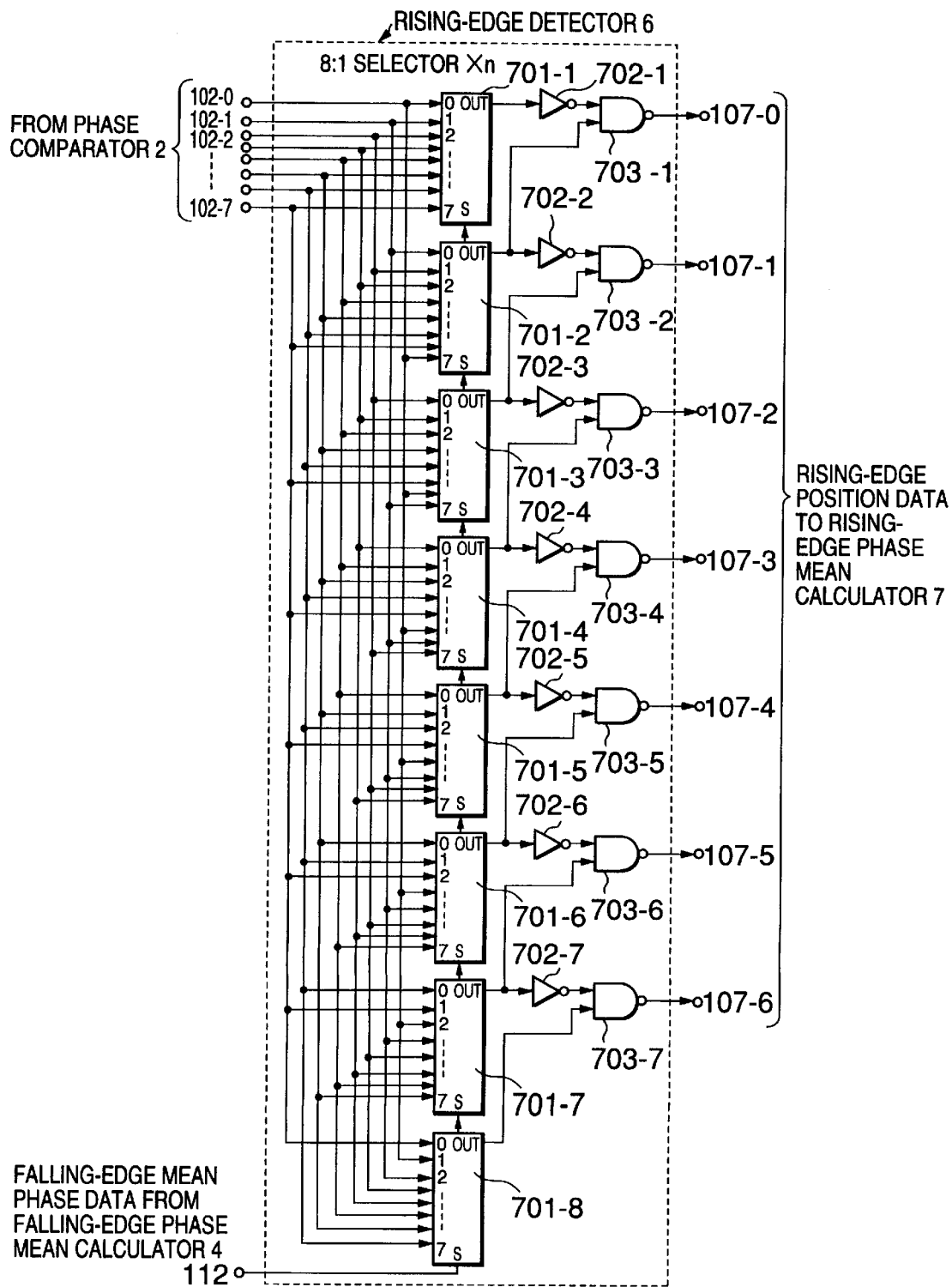
FIG. 5 is a diagram showing a circuit configuration of a rising-edge detector in the first embodiment.

Referring to FIG. 5, the rising-edge detector 6 is provided with the clock rotation circuit which is composed of eight 8:1 selectors 701-1 to 701-8. The respective 8:1 selectors 701-1 to 701-8 receive the 8 sampled data 102-0 to 102-7 in rotation based on the falling-edge mean phase value 112 received from the falling-edge phase mean calculator 4. In such a circuit configuration, the clock rotation circuit rearranges or rotates the N phase sampled data 102-0 to 102-7 in accordance with the first to N-th phase clocks to produce the N phase rearranged data. In other words, the N phase sampled data 102-0 to 102-7 are retimed on the basis of the first phase or reference clock 106.

The rising-edge detector 6 is further provided with seven rising-edge detecting circuits each comprising an inverter and an NAND gate. For example, the first rising-edge detecting circuit is composed of an inverter 702-1 and an NAND gate 703-1. The inverter 702-1 inputs the output of the first 8:1 selector 701-1 and outputs the inverted one to an input of the NAND gate 703-1. The NAND gate 703-1 further inputs the output of the second 8:1 selector 701-2. Similarly, the inverters 702-2 to 702-7 and the NAND gates 703-2 to 703-7 are connected, respectively, and the rising-edge position data 107-0 to 107-6 are output from the NAND gates 703-1 to 703-7, respectively. In this manner, the rising-edge detector 6 detects rising edges from the N phase rearranged data and outputs, every period, the rising-edge position data 107 which is represented by a value relative to the falling-edge mean phase value 112. The rising-edge position data 107 is output to the rising-edge phase mean calculator 7.

RISING-EDGE PHASE MEAN CALCULATOR

Figure 6:
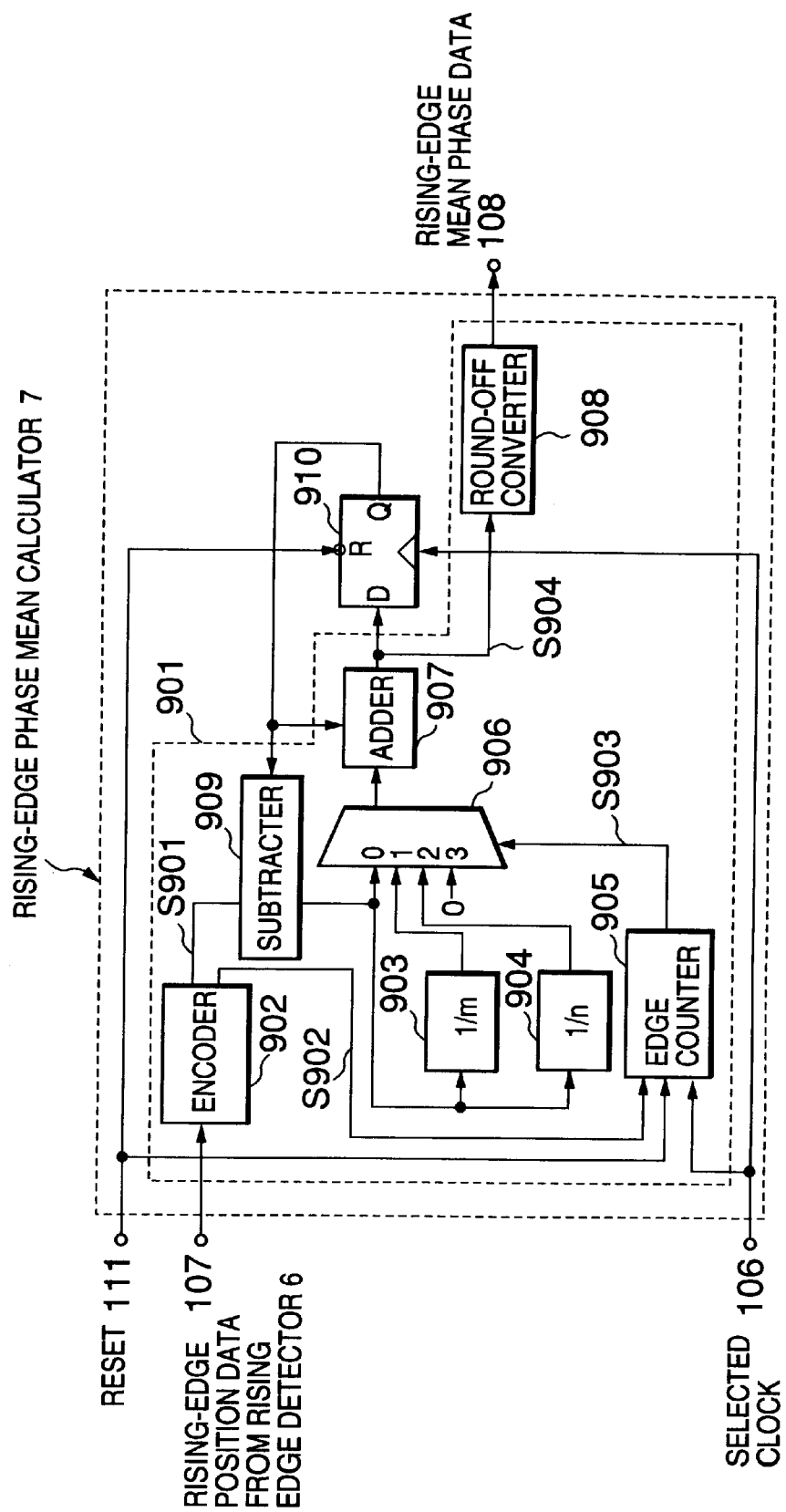
FIG. 6 is a diagram showing a circuit configuration of a rising-edge phase mean calculator of the first embodiment.

Referring to FIG. 6, the rising-edge phase mean calculator 7 includes the calculation section 901 and the flip-flop circuit 910. The calculation section 901 is composed of an encoder 902 that inputs the rising-edge position data 107 from the rising-edge detector 6 and converts it into an appropriate form to produce rising-edge position data S901 and rising-edge presence/absence information S902 (see FIG. 11). The rising-edge position data S901 is output to a subtracter 909 which subtracts a previous value stored in the flip-flop circuit 910 from the rising-edge position data S901. The rising-edge position difference between the previous value and the rising-edge position data S901 is output to a 1/m divider 903, a 1/n divider 904 and a selector 906. The 1/m divider 903 weights the rising-edge position difference by 1/m and the 1/n divider 904 weights it by 1/n.

The rising-edge phase mean calculator 7 also includes an edge counter 905 which counts the number of rising edges based on the rising edge presence/absence information S902 according to the selected clock 106 (see FIG. 12). The edge counter 905 is reset according to the reset signal 111. The count value S903 is output to the selector 906 according to the selected clock 106.

The selector 906 receives the rising-edge position difference, the 1/m-weighted rising-edge position difference, the 1/n-weighted rising-edge position difference, and zero at four input terminals indicated by 0, 1, 2, and 3, respectively. The selector 906 selects one of them according to the count value S903 received from the edge counter 905. More specifically, at the beginning of the input data IDATA, the selector 906 selects the rising-edge position difference. As the number rising edges increases, the weighting factor decreases sequentially in the order of 1, 1/m, 1/n, and zero.

A selected value is output to an adder 907. The adder 907 adds the selected value to the previous value stored in the flip-flop circuit 910 to produce the rising-edge mean phase value which in turn is stored onto the flip-flop circuit 910 according to the select clock 106. The flip-flop circuit 910 is reset by the reset signal 111. In this manner, the adder 907 and the flip-flop circuit 910 calculates the rising-edge mean phase value of phase numbers from the past rising phase number to the present rising phase number.

The rising-edge mean phase value from the adder 907 is output to a round-off converter 908. The round-off converter 908 rounds off the rising-edge mean phase value to produce the rising-edge mean phase data 108 (see FIG. 13).

DUTY JUDGING CIRCUIT

Figure 7:
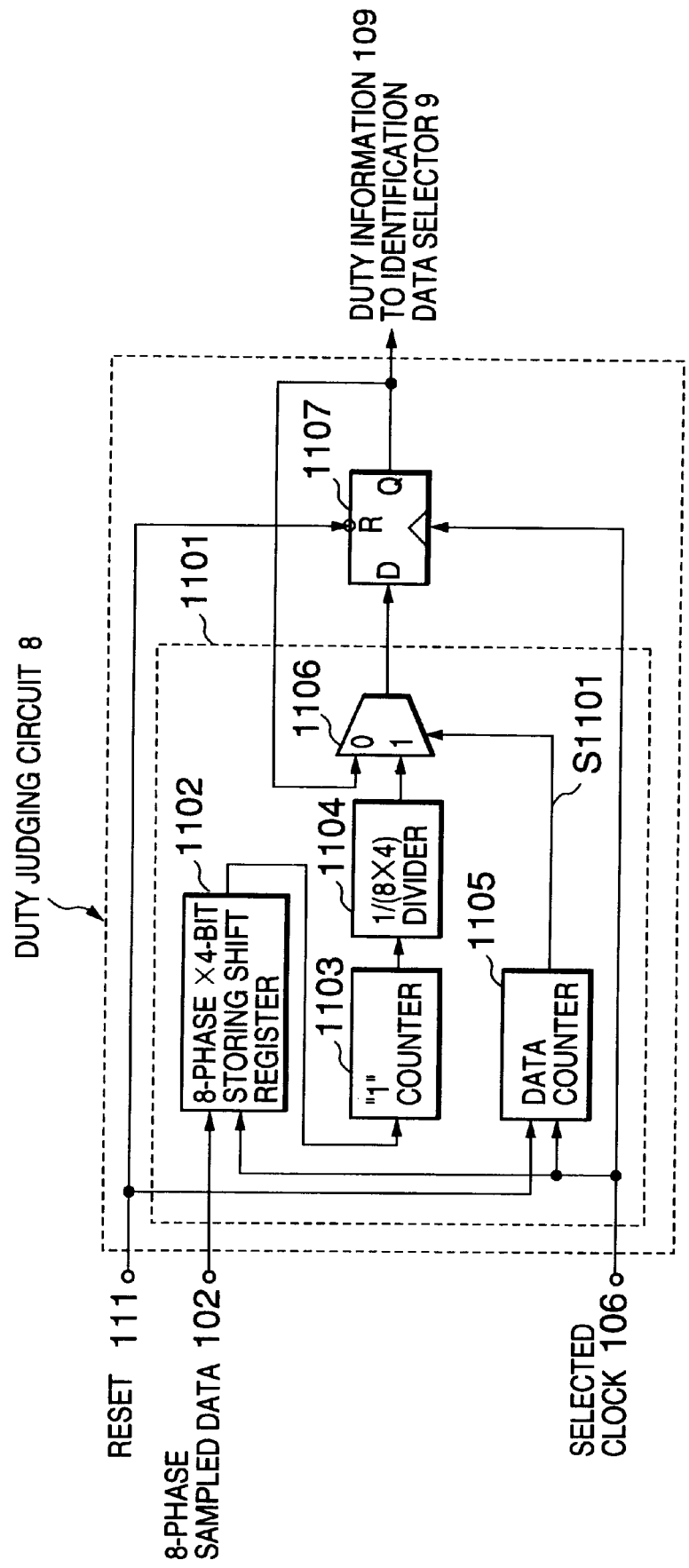
FIG. 7 is a diagram showing a circuit configuration of a duty judging circuit in the first embodiment.

Referring to FIG. 7, the duty judging circuit 8 is composed of the duty calculation section 1101 and a flip-flop circuit 1107. The duty calculation section 1101 includes a 8-phase×4-bit storing shift register 1102 which stores the 8-phase sampled data 102 by each four bits. A bit-state counter 1103 counts the number of "1" or "0" in the 8-phase×4-bit sampled data stored in the shift register 1102.

A 1/(8×4) divider 1104 divides the count value of the bit-state counter 1103 by 8×4=32 to produce duty Information. The data counter 1105 counts the number of data using the selected clock 106 and outputs the data count value S1101 to a selector 1106 (see FIG. 15).

The selector 1106 selects one of the duty information from the 1/(8×4) divider 1104 and the previous duty information stored in the flip-flop circuit 1107. The selected information is in turn stored onto the flip-flop circuit 1107 according to the selected clock 106. The duty information 109 is output from the flip-flop circuit 1107 to the data selector 9. The data counter 1105 and the flip-flop circuit 1107 are reset by the reset signal 111.

In general, the duty judging circuit 8 inputs the alternating data of "1" and "0" for M bits (M is an integer of 2 or more) as the N phase sampled data 102 and counts the number of "1" or the number of "0". By dividing the count value by (N×M), the duty information 109 is obtained.

DATA SELECTOR

Figure 8:
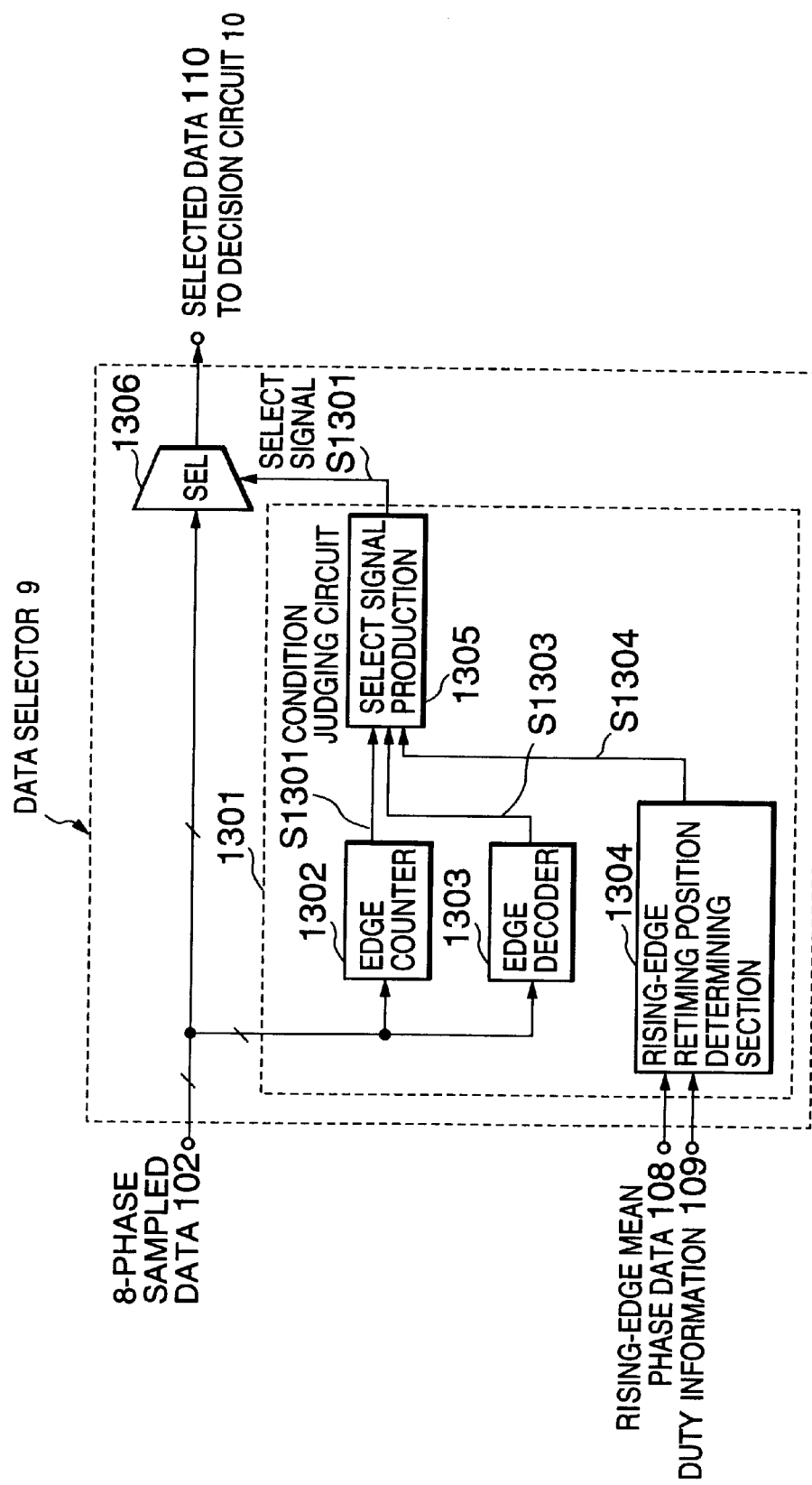
FIG. 8 is a diagram showing a circuit configuration of a data selector in the first embodiment.

Referring to FIG. 8, the data selector 9 includes the condition judging circuit 1301 and a selector 1306. The condition judging circuit 1301 is composed of an edge counter 1302 that counts the number of edges based on 8-phase sampled data 102 to produce edge count information S1302 (see FIG. 17). An edge decoder 1303 produces phase selection Information S1303 in the case where two edges exist with one cycle of the selected clock 106 based on the 8-phase sampled data 102 (see FIG. 18).

Figure 19:
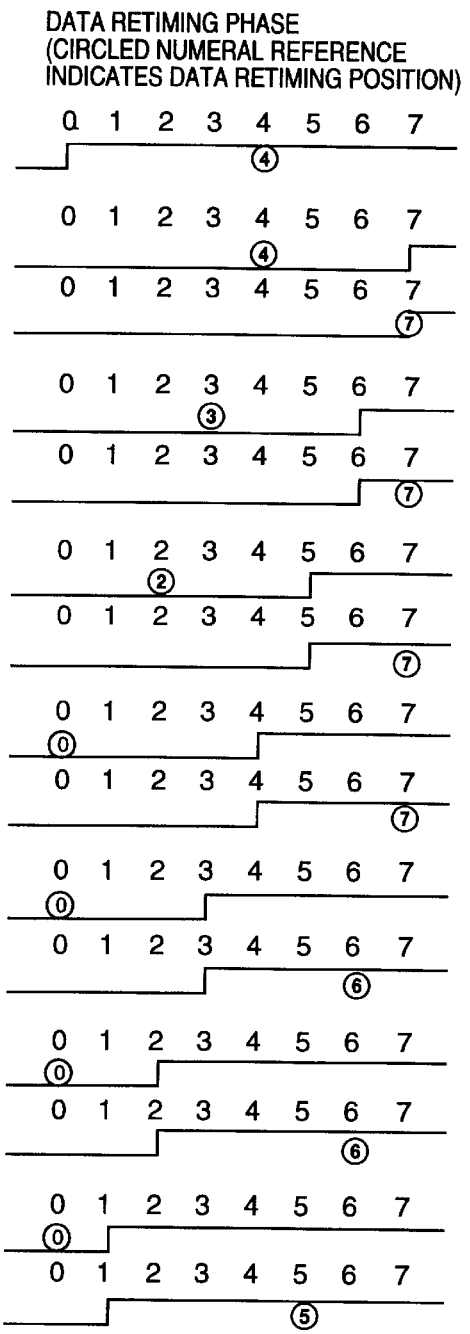
FIG. 19 is a diagram showing the operation of rising-edge retiming position determining section of the data selector in the first embodiment.

The data selector 9 also includes a rising-edge retiming position determining section 1304 which produces retiming position information S1304 in the case where one rising edge exist with one cycle of the selected clock 106 based on the rising-edge mean phase data 108 and the duty information 109 (see FIG. 19).

A select signal producing section 1305 produces a select signal S1301 according to the edge count information S1302 received from the edge counter 1302, the phase selection information S1303 received from the edge decoder 1303 and the retiming position information S1304 received from the rising-edge retiming position determining section 1304 (see FIG. 20). The selector 1306 selects one from the 8-phase sampled data 102 according to the select signal S1301 (see FIG. 21).

N:1 CLOCK SELECTOR

Figure 9:
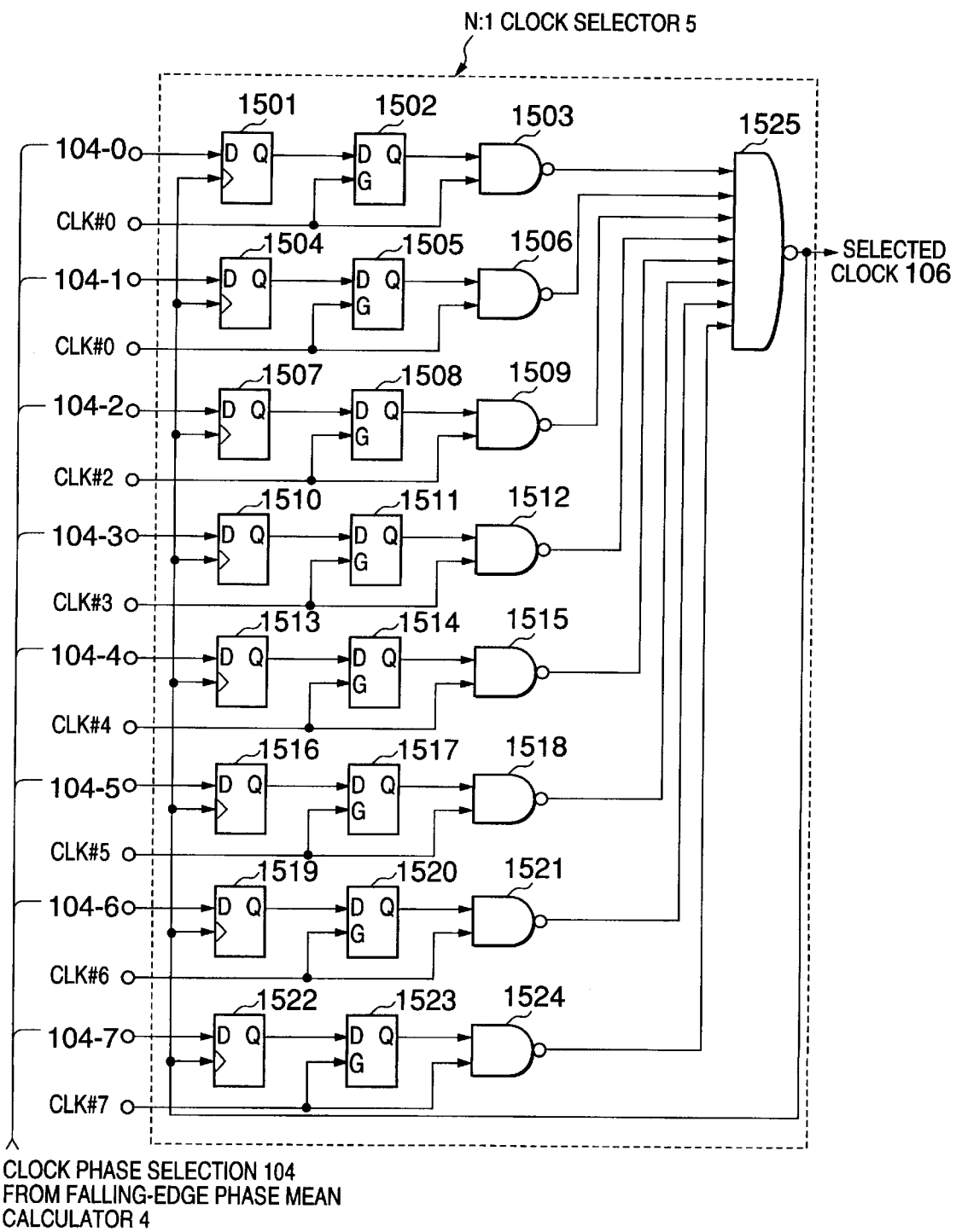
FIG. 9 is a diagram showing a circuit configuration of an N:1 clock selector in the first embodiment.

As shown in FIG. 9, the N:1 clock selector 5 is composed of eight sets of two D-type flip-flop circuits and a NAND gate. For example, the first set is composed of D-type flip-flop circuits 1501 and 1502 and a NAND gate 1503. The D-type flip-flop circuit 1501 inputs the clock phase selection data 104 from the falling-edge phase mean calculator 4 and outputs it to the D-type flip-flop circuit 1502 according to the selected clock 106. The D-type flip-flop circuit 1502 outputs the clock phase selection data 104 to the NAND gate 1503 according to a first clock CLK#0 of the multi-phase clock. The NAND gate 1503 performs the NAND function of the output of the D-type flip-flop circuit 1502 and the first clock CLK#0 and outputs the result to a NAND gate 1525. Similarly second to 8-th set are arranged.

Hereinafter, an operation of the first embodiment will be described. In this embodiment, since the operation is made with the phase of the falling edge as a reference, the phase of the rising edge is indicated by a distance relative to the falling-edge mean phase value 112.

As shown in FIGS. 10A–10D, the phase clocks CLK#0–CLK#7 of the multi-phase clock signal 105 are identical in frequency with the input data IDATA but the phases of the N phase clocks are sequentially shifted by 360 degrees/N. Using the 8-phase clocks CLK#0–CLK#7, the flip-flop circuits of the sampling section 1 sample the input data IDATA to produce the 8-phase sampled data 101-0 to 101-7 as shown in FIG. 10D. The Input data IDATA may vary in frequency, duty ratio and/or jitter at random.

In the case where the clock phase selection 104 is "2" as shown in FIG. 10C, the N:1 clock selector 5 selects the clock CLK#2 and outputs it to the flip-flop circuits of the phase comparing section 2. Therefore, the phase comparing section 2 performs phase comparison to output a difference between the phase of the current selected clock and the phase of the input data IDATA. In other words, the respective flip-flop circuits retime the 8-phase sampled data 101 in synchronization with the selected clock CLK#2 to produce 8-phase sampled data 102 which are output to the falling-edge detector 3, the rising-edge detector 6, the duty judging circuit 8 and the data selector 9.

The falling-edge detector 3 detects the falling-edge position data 103 according to the 8-phase sampled data 102 and the falling-edge mean phase value 112. The falling-edge position data 103 thus detected is indicative of a difference between the selected clock CLK#2 and the falling edge phase of the input data IDATA.

As shown in FIG. 11, the encoder 502 of the falling-edge phase mean calculator 4 inputs the falling-edge position data 103 from the falling-edge detector 3 and converts it into an appropriate form to produce falling-edge position data S501 and falling-edge presence/absence information S502.

As shown in FIG. 12, the edge counter 505 of the falling-edge phase mean calculator 4 counts the number of falling edges based on the falling edge presence/absence information S502 according to the selected clock 106. The count value S503 is output to a selector 506 according to the selected clock 106.

The selector 506 selects the falling-edge position data S501. As the number falling edges increases, the weighting factor decreases sequentially in the order of 1, 1/m, 1/n, and zero. In other words, the selector selects a weighting factor from 1 times, 1/m times and 1/n times according to the count value S503. Therefore, the falling-edge mean phase value S504 usually has an integer part and a decimal fraction. In this embodiment, as the falling-edge position is close to the head of the input data in bursts, the magnification is larger, whereas it is far from the head, the magnification is smaller, and finally changed to 0 times. This is because the falling-edge mean phase value 104 is more rapidly made close to the input data as the falling-edge position is close to the head of the burst-like data, and the following property is made smaller as it is far from the head to ensure the jitter resistance.

Subsequently, the adder 507 adds the falling-edge mean phase value 104 to the previous falling-edge mean phase value 112 stored in the flip-flop circuit 509.

Figures 13, 14:
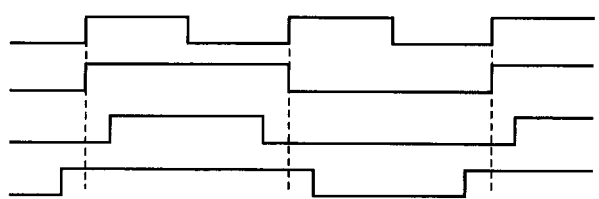
FIG. 13 is a diagram showing the logic of round-off conversion of falling-edge/rising-edge phase mean calculator in the first embodiment.
FIG. 14 is a diagram showing duty variations in input data for explanation of duty judgement in the first embodiment.

Referring to FIG. 13, the falling-edge mean phase value 5504 has an integer part and a decimal fraction which are shown as S504-2, S504-1, S504-0 and S504-0.1. Therefore, the decimal fraction is finally rounded off by the round-off converter 508. More specifically, in the case where the integer data of S504-2, S504-1 and S504-0 are 0 and the decimal fraction data of S504-0.1 is 1, the falling-edge position is positively shifted by a half 360 degrees/8 or more from the first clock phase CLX#0, resulting in the second clock phase CLK#1 selected. In the case where the integer data of S504-2 and S504-1 are 0, the integer data of S504-0 is 1, and the decimal fraction data of S504-0.1 is 0, the falling-edge position is not shifted or positively shifted by less than a half 360 degrees/8 or more from the second clock phase CLK#1, resulting in the second clock phase CLK#1 also selected.

Similarly, the rising-edge phase mean calculator 7 outputs the rising-edge mean phase value 108 as shown in FIGS. 11–13.

Subsequently, the operation of the duty judging circuit 8 will be described.

The duty judging circuit 8 as shown in FIG. 7 extracts the alternating data of "0" and "1" which are positioned at the head of the input data, and calculates a period of "1" and a period of "0" through the duty calculation section 1101 to detect the duty information 109 of the input data.

Referring to FIG. 14, there is shown the definition of the duty of the input data with respect to the reference clock. The duty ratio of input data IDATA-1 is 100% because the width of "1" is the same as the period of the reference clock. Since the width of "1" of input data IDTA-2 is less than the period of the reference clock, the duty ratio of input data IDATA-2 is less than 100%. Since the width of "1" of input data IDTA-3 exceeds the period of the reference clock, the duty ratio of input data IDATA-3 exceeds 100%.

In the duty judgment, the 8-phase×4-bit data are made to be stored in the 8-phase×4-bit storing shift register 1102 as shown in FIG. 7. Then, the "1" state count 1103 counts the number of "1" in the 8-phase×4-bit data stored. Then, it is divided by 8×4=32 to provide the duty information 109.

As shown in FIG. 15, the duty information of the alternating data of "0" and "1" at the head of the burst-like data is stored through the operation of the edge counter 1105, the selector 1106, the flip-flop circuit 1107. The duty information is held until the reset signal 111 indicative of the head of the subsequent burst-like data is inputted.

Subsequently, the operation of the data selector 9 will be described.

In the data selector 9 as shown in FIG. 8, the condition judging circuit 1301 determines a phase to be selected with one cycle of the select clock 106 depending on the rising-edge mean phase value 108 and the duty information 109. According to the phase selection judgement, the selector 1306 selects one of the 8-phase sampled data 102 received from the phase comparing section 2.

As shown in FIGS. 16A–16F, within the cycle of the selected clock 106, the number of edges are classified into four kinds of states where no edge of IDATA-1 and IDATA-2, one falling edge of IDATA-3, one rising edge of IDATA-4 and two edges of IDATA-5. These states are used to adaptively determine the selected phase.

Figure 17:
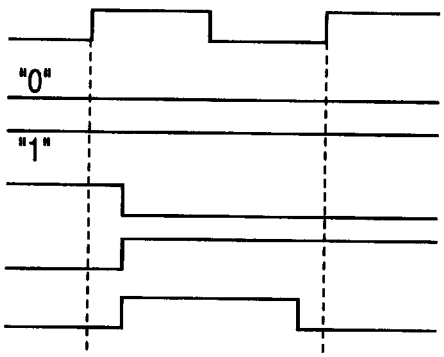
FIG. 17 is a diagram showing the logic of edge counter of the data selector in the first embodiment.

Referring to FIG. 17, the edge counter 1302 counts the number of edges with respect to the selected clock 106 to produce the edge count value $C_{EDGE}$. In the case of no edge of IDATA-1 and IDATA-2, since the edge count value $C_{EDGE}$=0, the edge counter 1302 outputs the count data S1302 of 0 to the select signal production section 1305. In the case of one falling edge of IDATA-3, since the edge count value $C_{EDGE}$=1, the edge counter 1302 outputs the count data S1302 of 1 to the select signal production section 1305. In the case of one rising edge of IDATA-4, since the edge count value $C_{EDGE}$=1, the edge counter 1302 outputs the count data S1302 of 2 to the select signal production section 1305. In the case of two edges of IDATA-5, since the edge count value $C_{EDGE}$=2, the edge counter 1302 outputs the count data S1302 of 3 to the select signal production section 1305.

Referring to FIG. 18, in case of two edges of IDATA-5, the phase to be selected is determined by the edge decoder 1303.

Also, at the same time, the select phase in case of one rising edge is determined according to the rising-edge mean phase value 108 and the duty information 109 by the rising-edge retiming position determining section 1304.

As shown in FIG. 19, for example, in the case where the rising-edge mean phase value 108 is 0, which means that the rising edge of the input data IDATA is synchronized with the reference clock phase, the retiming position is the data timing phase '4', that is, the retiming position data S1304 is '00001000'.

In the case where the rising-edge mean phase value 108 is 3, which means that the rising edge of the input data IDATA is shifted from the reference clock phase by 3 phases, and the duty information is more than 125%, the retiming position is the data timing phase '0', that is, the retiming position data S1304 is '10000000'. On the other hand, in the case of the duty information of 125% or less, the retiming position is the data timing phase '6', that is, the retiming position data S1304 is '00000010'. Such data decision position determination ensures reliable and stable data decision.

Then, as shown in FIG. 20, the selected phase is determined by the select signal production section 1305 according to the four kinds of states which are classified by the number of edges. More specifically, when the count data S1302 is 0 or 1, the select signal S1301 is '00001000' which instructs the selector 1306 to select the phase number '4'. When the count data S1302 is 2, the select signal S1301 is determined by the retiming position data S1304 received from the rising-edge retiming position determining section 1304. When the count data S1302 is 3. The select signal S1301 is determined by the phase selection data S1303 received from the edge decoder 1303.

Finally, as shown in FIG. 21, the selector 1306 selects one from the 8-phase sampled data 102 according to the select signal S1301 received from the select signal production section 1305.

ANOTHER DATA SELECTOR

Figure 22:
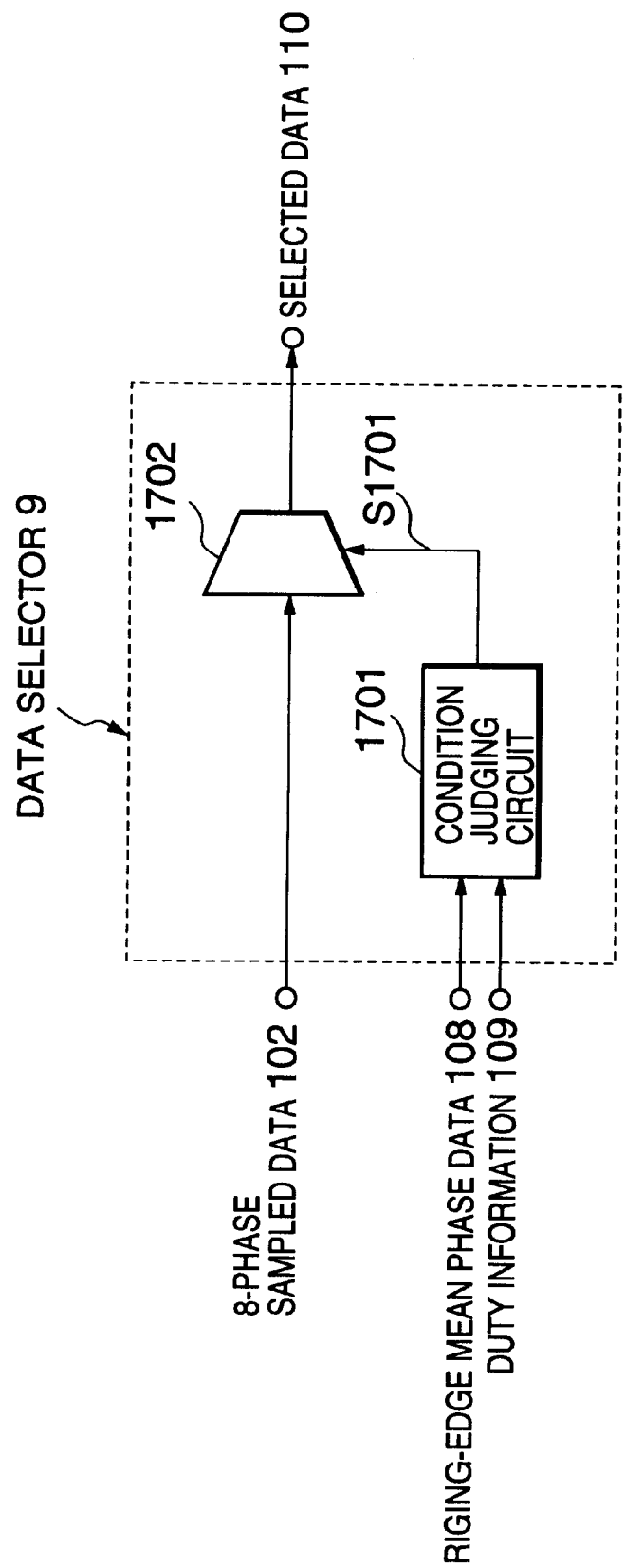
FIG. 22 is a diagram showing another circuit configuration of a data selector in the first embodiment.

Referring to FIG. 22, another circuit configuration of the data selector 9 may be employed. The data selector 9 includes a condition judging circuit 1701 and a selector 1702. The condition judging circuit 1701 produces retiming position data S1701 based on the rising-edge mean phase value 108 and the duty information 109.

Figure 23:
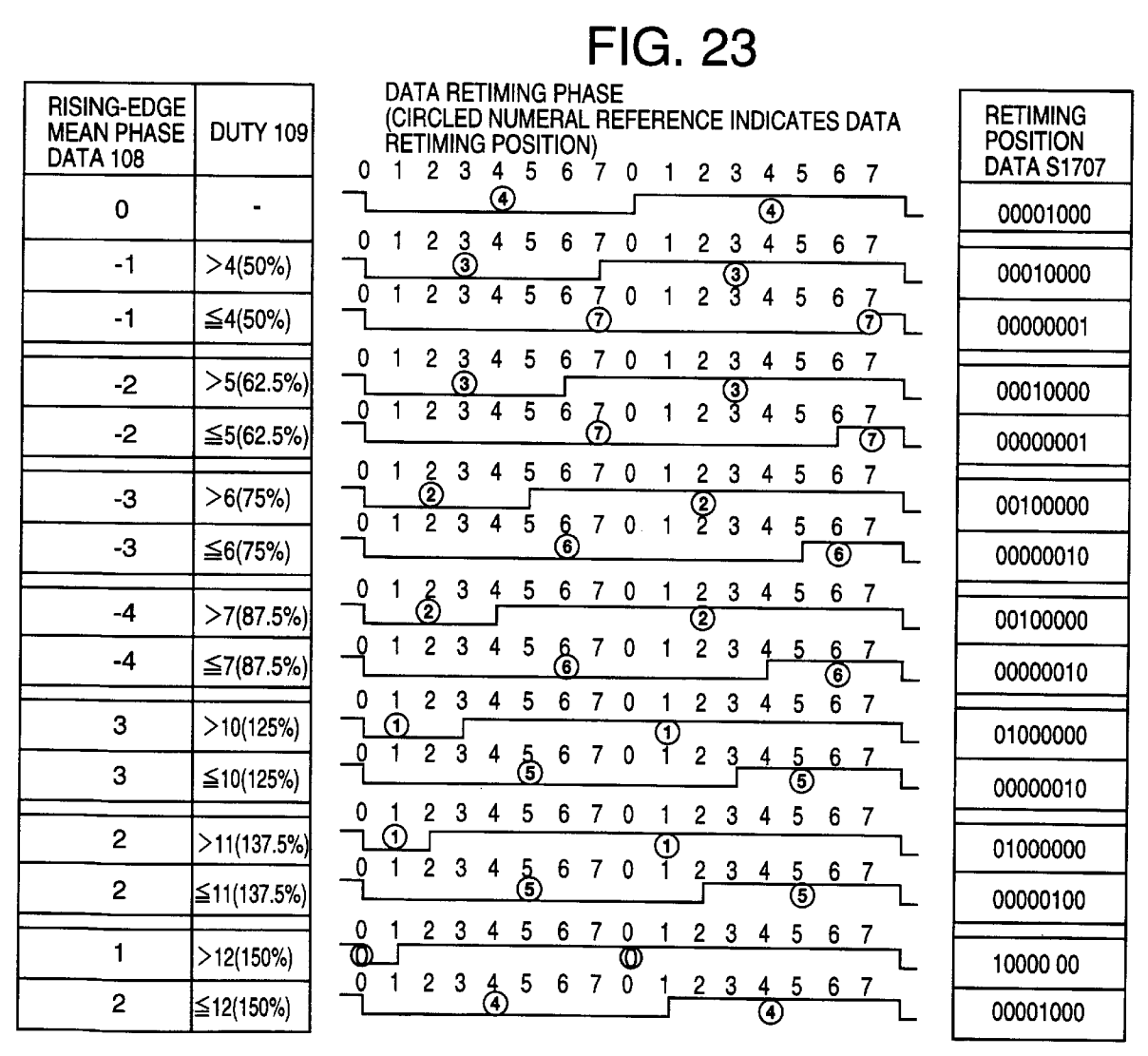

Referring to FIG. 23, the condition judging circuit 1701 performs data retiming based on the rising-edge mean phase value 108 and the duty information 109. More specifically, in the case where the rising-edge mean phase value 108 is 0. The retiming position data S1701 is '00001000' by which the retiming position is set to the mid phase number '4'. In the case where the rising-edge mean phase value 108 is −1 which means that the rising edge is positioned at the phase number '7', the retiming position is set to the phase number '3' when the duty information 109 is greater than 50% and to the phase number '7' when the duty information 109 is not greater than 50%. In the case where the rising-edge mean phase value 108 is 3 which means that the rising edge is positioned at the phase number '3', the retiming position is set to the phase number '1' when the duty information 109 is greater than 125% and to the phase number '5' when the duty information 109 is not greater than 125%.

SECOND EMBODIMENT

Figure 24:
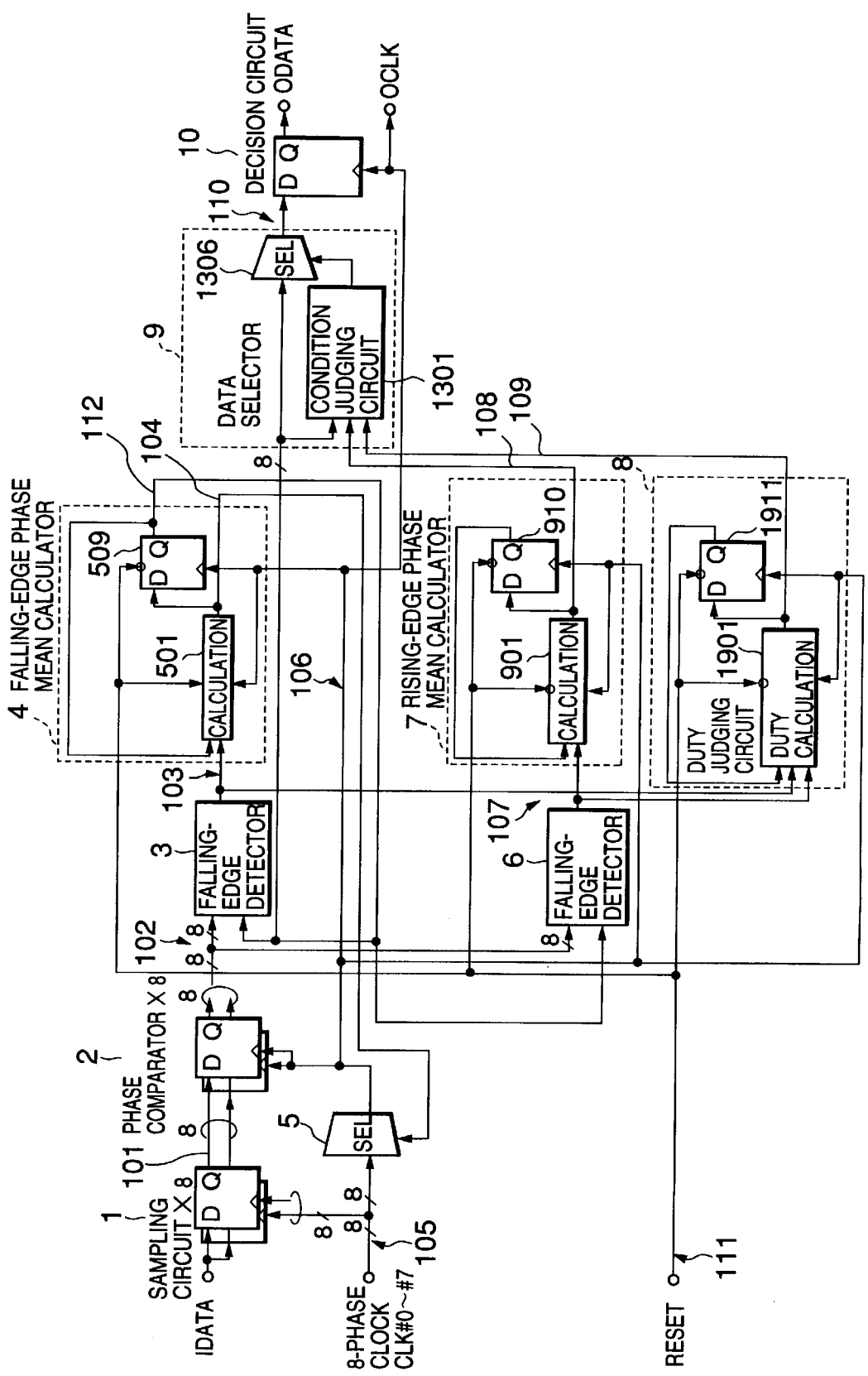
FIG. 24 is a schematic block diagram showing the a digital PLL circuit according to a second embodiment of the present invention.

FIG. 24 shows the second embodiment of the digital PLL circuit according to the present invention, where circuit blocks similar to those previously described with reference to FIG. 2 are denoted by the same reference numerals and the details are omitted.

In this embodiment, the duty judging circuit 8 is designed to produce the duty information 109 by receiving the falling-edge position data 103 from the falling-edge detector 3 and the rising-edge position data 107 from the rising-edge detector 6. More specifically, the duty judging circuit 8 stores M×N falling-edge position data 103 and M×N rising-edge position data 107 corresponding to the preamble data which is the alternating data of "1" and "0" and calculates the duty information by averaging differences between a data change position from '0' to '1' and a data change position from '1' to '0' of the N phase sampled data for M bits.

Figure 25:
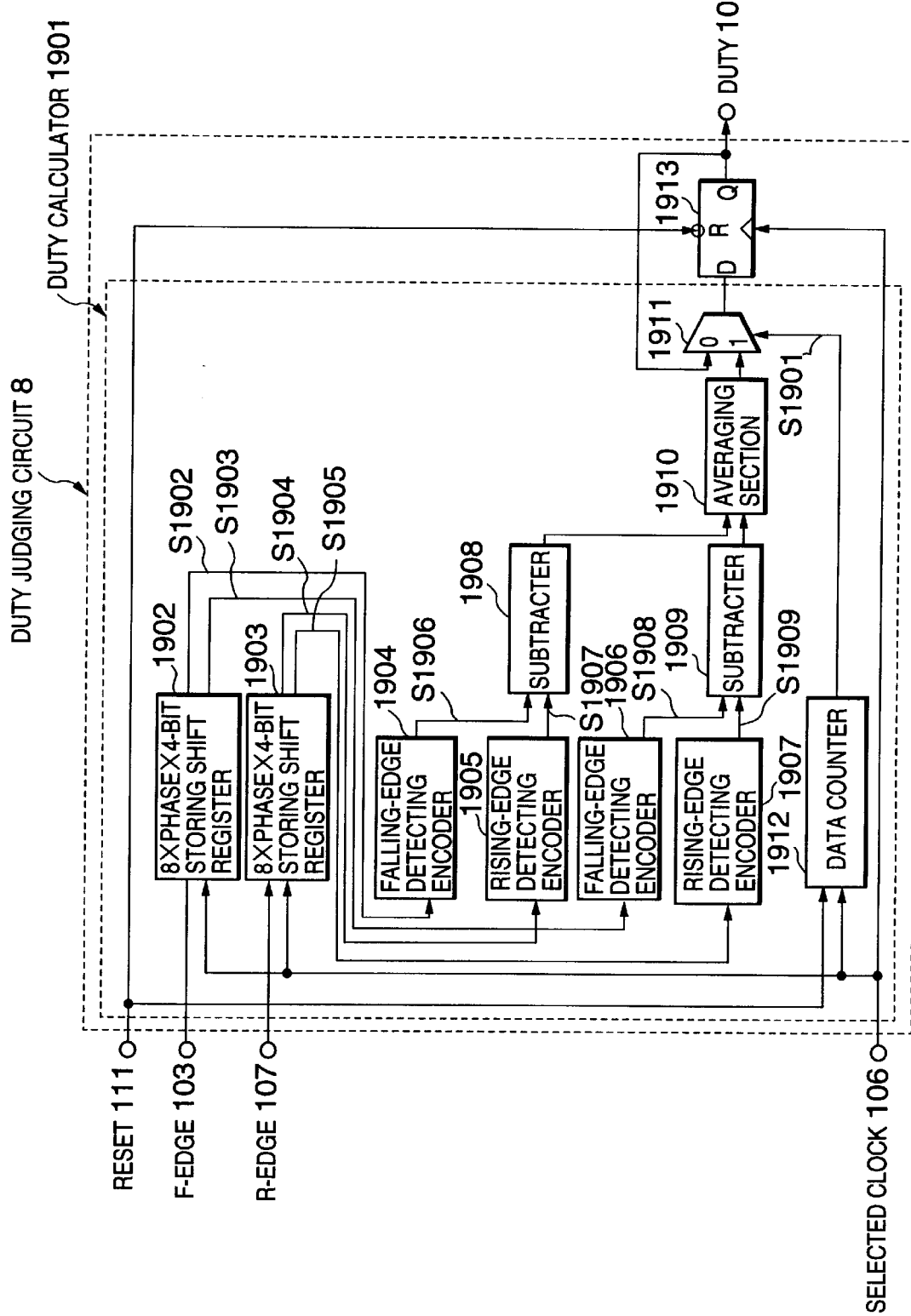
FIG. 25 is a diagram showing a circuit configuration of a duty judging circuit in the second embodiment.
Figure 27:
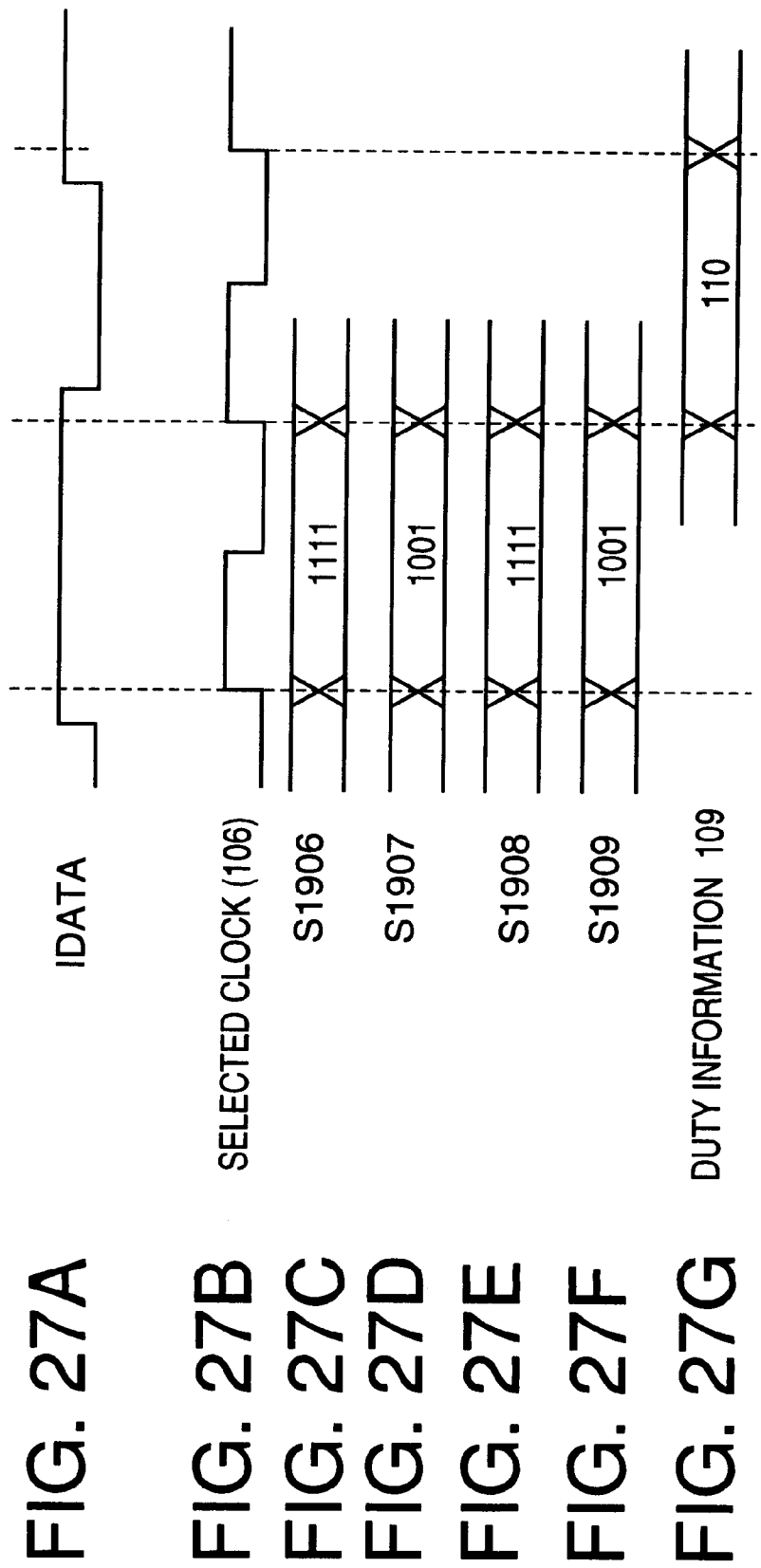
FIGS. 27A–27G are timing charts showing a specific operation of the duty calculator in the second embodiment.

Referring to FIG. 25, the duty judging circuit 8 is composed of a duty calculator 1900 and a flip-flop circuit 1913. The duty calculator 1900 includes an 8-phase×4-bit storing shift register 1902 and an 8-phase×4-bit storing shift register 1903.

The shift register 1902 stores the falling-edge position data 103 for 4 bits according to the selected clock 106. The leftmost 2 bits thereof is output as leftmost 2-bit data S1902 to a falling-edge detecting encoder 1904 and the rightmost 2 bits thereof is output as rightmost 2-bit data S1903 to a falling-edge detecting encoder 1906.

The shift register 1903 stores the rising-edge position data 107 for 4 bits according to the selected clock 106. The leftmost 2 bits thereof is output as leftmost 2-bit data S1904 to a rising-edge detecting encoder 1905 and the rightmost 2 bits thereof is output as rightmost 2-bit data S1905 to a falling-edge detecting encoder 1907.

The falling-edge detecting encoder 1904 produces falling-edge phase data S1906 from the leftmost 2-bit data S1902 received from the shift register 1902 and outputs it to a subtracter 1908. The rising-edge detecting encoder 1905 produces rising-edge phase data S1907 from the leftmost 2-bit data S1904 received from the shift register 1903 and outputs it to the subtracter 1908. The falling-edge detecting encoder 1906 produces falling-edge phase data S1908 from the rightmost 2-bit data S1903 received from the shift register 1902 and outputs it to a subtracter 1909. The rising-edge detecting encoder 1907 produces rising-edge phase data S1909 from the rightmost 2-bit data S1905 received from the shift register 1903 and outputs it to the subtracter 1909.

The subtracter 1908 calculates a phase difference between the rising-edge phase data S1907 and the falling-edge phase data S1906 to output duty information to an averaging section 1910. The subtracter 1908 calculates a phase difference between the rising-edge phase data S1909 and the falling-edge phase data S1908 to output duty information to the averaging section 1910. The averaging section 1910 outputs averaged duty information to a selector 1911.

The selector 1911 selects one of the averaged duty information from the averaging section 1910 and the previous duty information stored in the flip-flop circuit 1913 depending on data count value S1901 which is received from a data counter 1912. The data counter 1912 counts the number of data using the selected clock 106 and outputs the data count value S1901 to the selector 1911 (see FIG. 15). The selected information is in turn stored onto the flip-flop circuit 1913 according to the selected clock 106. The duty information 109 is output from the flip-flop circuit 1913 to the data selector 9. The data counter 1912 and the flip-flop circuit 1913 are reset by the reset signal 111.

Referring to FIG. 26, each of the encoders 1904–1907 performs the encoding of 8-phase×2-bit data according to the predetermined logic.

As shown in FIGS. 27A–27G, in the case where the falling-edge phase data S1906 is '1111', the rising-edge phase data S1907 is '1001', the falling-edge phase data S1908 is '1111', and the rising-edge phase data S1909 is '1001', the averaging section 1910 outputs the duty information 109 of '110'.

Figure 28:
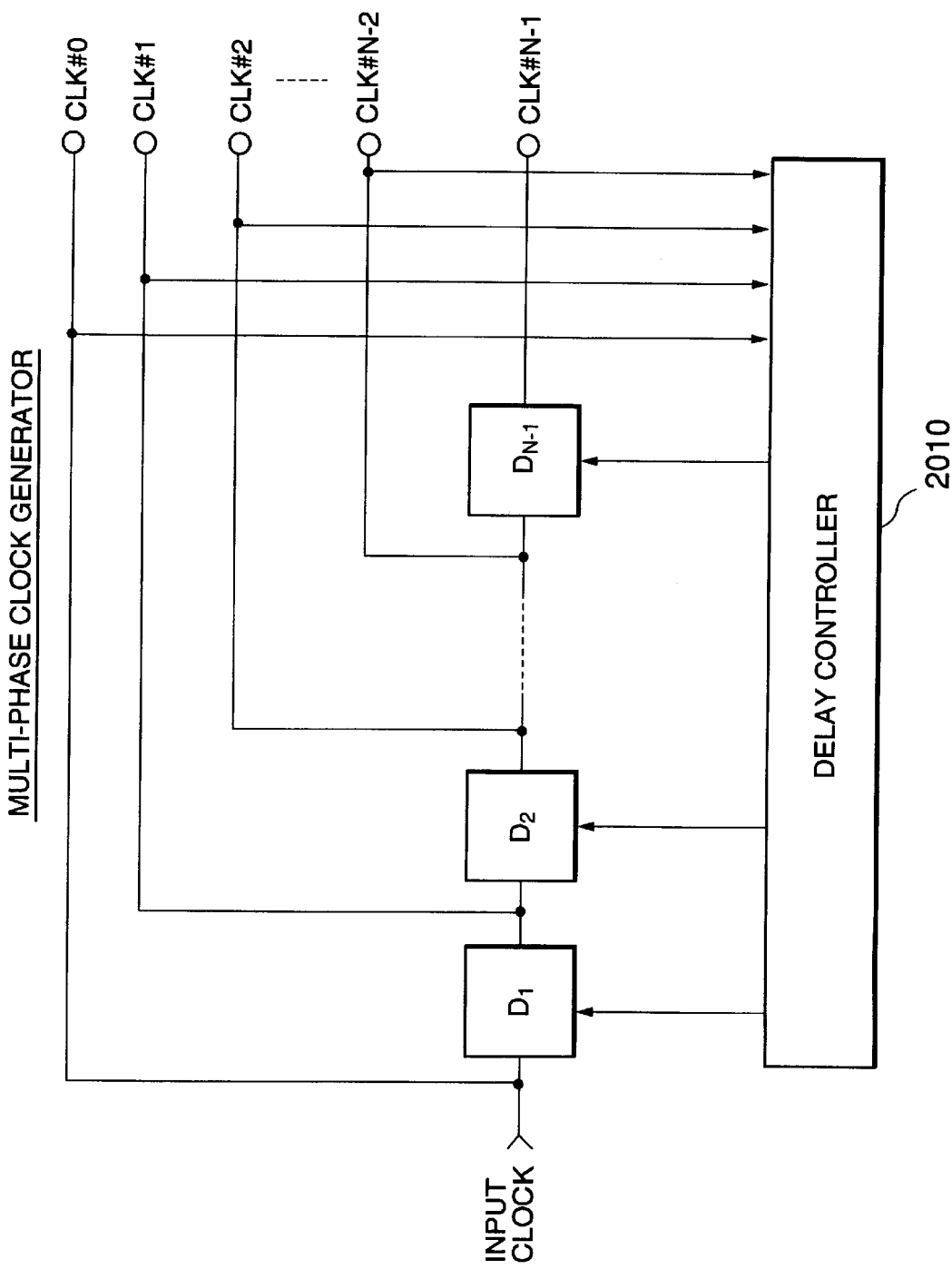
FIG. 28 is a block diagram showing a circuit configuration of a multi-phase clock generator.

Referring to FIG. 28, a multi-phase clock generator may be employed to generate the N phase clocks CLK#0–CLK# (N−1) of the multi-phase clock signal 105 which are identical in frequency with the input data IDATA but the phases of the N phase clocks are sequentially shifted by 360 degrees/N. The multi-phase clock generator includes a tapped delay line comprising delay circuits $D_1$–$D_{N-1}$ each having a phase delay of 360 degrees/N. The tapped clock signals are output as the N phase clocks CLK#0–CLK# (N−1) to the digital PLL circuit as shown in FIGS. 2 and 24. Further, the N phase clocks CLK#0–CLK# (N−1) are fed back to a delay controller 2010 which controls each delay amount of each of the delay circuits $D_1$–$D_{N-1}$. The circuit configuration as shown in FIG. 28 is just an example.

As described above, the digital PLL circuit according to the present invention is structured so as to measure and recognize the amount of duty fluctuation. Therefore, the input data is retimed without any error. In other words, no error occurs in the determination of the data decision point at which the input data is identified even at the time of a large duty fluctuation.

Further, the tracking rate can be varied at an arbitrary bit interval in the case where both of the rising- and falling-edge phases are averaged and are used to extract the clock. Therefore, the clock signal can be extracted by several bits from the head of the burst-like data signal varying in phase, duty fluctuation and the amount of jitters for each burst. Furthermore, the data signal can be recognized without any error even in the case of the burst-like data signal subject to jitters. Therefore, the data identification can be performed without any error.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed:

1. A digital PLL circuit, comprising:
    a sampler for sampling a burst data signal depending on N phase clock signals to produce N phase sampled data signals;
    an edge phase detector for detecting edge information based on the N phase sampled data signals in synchronization with a reference signal;
    a duty selector for detecting duty information based on a bit count value produced by counting bits having a predetermined value of the predetermined number of bits of the N phase sampled data signals and a ratio of the bit count value to the predetermined number as the duty information;
    a selector for selecting an optimal sampled data signal from the N phase sampled data signals depending on a selected selection pattern determined by an edge count value, the edge information and the duty information; and
    a retiming section for retiming the sampled data signal selected in synchronization with the reference signal.

2. The digital PLL circuit according to claim 1, wherein the duty detector comprises:
    a memory for storing the predetermined number of bits of the N phase sampled data signals;
    a counter for counting bits having a predetermined value of the predetermined number of bits of the N phase sampled data signals to produce a bit count value; and
    a duty calculator for calculating a ratio of the bit count value to the predetermined number as the duty information.

3. The digital PLL circuit according to claim 1, wherein the edge phase detector comprises:
    a position detector for detecting edge position information from the N phase sampled data signals; and
    a mean calculator for calculating a mean value of the edge position information for the N phase sampled data signals to produce the mean value as the edge information.

4. The digital PLL circuit according to claim 3, wherein the duty detector detects the duty information based on the edge position Information.

5. The digital PLL circuit according to claim 1. wherein the edge phase detector comprises:
    a falling-edge position detector for detecting falling-edge position information from the N phase sampled data signals;
    a rising-edge position detector for detecting rising-edge position information from the N phase sampled data signals;
    a falling-edge mean calculator for calculating a falling-edge mean value of the falling-edge position information for the N phase sampled data signals; and
    a rising-edge mean calculator for calculating a rising-edge mean value of the rising-edge position information for the N phase sampled data signals.

6. The digital PLL circuit according to claim 5, wherein the duty detector detects the duty information based on the falling-edge position information and the rising-edge position information.

7. The digital PLL circuit according to claim 6, wherein the duty detector comprises:
    a first memory for storing a predetermined number of bits of the falling-edge position information;
    a second memory for storing the predetermined number of bits of the rising-edge position information;
    a duty calculator for calculating the duty information based on a first length from a rising edge to a falling edge and a second length from a falling edge to a rising edge.

8. The digital PLL circuit according to claim 1, wherein the selector comprises:
    an edge counter for counting edges based on the N phase sampled data signals to produce an edge count value every period of the selected clock signal;
    a selection pattern selector for selecting one of a plurality of selection patterns determined by the edge count value, the edge information and the duty information; and
    a signal selector for selecting one of the N phase sampled data signals depending on a selected selection pattern.

9. The digital PLL circuit according to claim 1, wherein the selector comprises:
    a selection pattern selector for selecting one of a plurality of selection patterns determined by the edge information and the duty information; and
    a signal selector for selecting one of the N phase sampled data signals depending on a selected selection pattern.

10. A digital PLL circuit comprising:
    a clock selector for selecting one of N phase clock signals depending on a select signal indicative of which of the N phase clock signals should be selected, wherein the N phase clock signals are identical In frequency with a burst data signal and sequentially shifted in phase by 360 degrees/N;
    a sampler for sampling the burst data signal depending on the N phase clock signals to produce N phase sampled data signals;
    a rearranging section for rearranging the N phase sampled data signals in synchronization with a selected clock signal to produce N phase rearranged data signals;
    an edge detector for detecting falling-edge position information and rising-edge position information based on the N phase sampled data signals;

a mean calculator for calculating a falling-edge mean value of the falling-edge position information and a rising-edge mean value of the rising-edge position information for the N phase sampled data signals in synchronization with the selected signal;

a select signal generator for generating the select signal from the falling-edge mean value;

a duty detector for detecting duty information based on the N phase sampled data signals in synchronization with the selected signal;

a selector for selecting an optimal sampled data signal from the N phase sampled data signals depending on the rising-edge mean value and the duty information; and a retiming section for retiming the sampled data signal selected in synchronization with the selected signal.

11. The digital PLL circuit according to claim 10, wherein the mean calculator calculates the falling-edge mean value and the rising-edge mean value such that a smaller weighting factor is applied to the falling-edge mean value and the rising-edge mean value as a number of edges is increased.

12. The digital PLL circuit according to claim 10, wherein the duty detector detects the duty information from a predetermined number of bits of the N phase sampled data signals.

13. The digital PLL circuit according to claim 12, wherein the duty detector comprises:

a memory for storing the predetermined number of bits of the N phase sampled data signals;

a counter for counting bits having a predetermined value of the predetermined number of bits of the N phase sampled data signals to produce a bit count value; and a duty calculator for calculating a ratio of the bit count value to the predetermined number as the duty information.

14. The digital PLL circuit according to claim 10, wherein the duty detector detects the duty information based on the falling-edge position information and the rising-edge position information.

15. The digital PLL circuit according to claim 14, wherein the duty detector comprises:

a first memory for storing a predetermined number of bits of the falling-edge position information;

a second memory for storing the predetermined number of bits of the rising-edge position information;

a duty calculator for calculating the duty information based on a first length from a rising edge to a falling edge and a second length from a falling edge to a rising edge.

16. The digital PLL circuit according to claim 10, wherein the selector comprises:

an edge counter for counting edges based on the N phase sampled data signals to produce an edge count value every period of the selected clock signal;

a selection pattern selector for selecting one of a plurality of selection patterns determined by the edge count value, the edge information and the duty information; and a signal selector for selecting one of the N phase sampled data signals depending on a selected selection pattern.

17. The digital PLL circuit according to claim 10, wherein the selector comprises:

a selection pattern selector for selecting one of a plurality of selection patterns determined by the edge information and the duty information; and a signal selector for selecting one of the N phase sampled data signals depending on a selected selection pattern.

18. A retiming method for a digital PLL circuit, comprising the steps of:

sampling a burst data signal depending on N phase clock signals to produce N phase sampled data signals;

detecting edge information based on the N phase sampled data signals in synchronization with a reference signal;

detecting duty information based on a bit count value produced by counting bits having a predetermined value of the predetermined number of bits of the N phase sampled data signals and a ratio of the bit count value to the predetermined number as the duty information;

selecting an optimal sampled data signal from the N phase sampled data signals depending on a selected selection pattern determined by an edge count value, the edge information and the duty information; and retiming the sampled data signal selected in synchronization with the reference signal.

19. A retiming method for a digital PLL circuit, comprising the steps of:

selecting one of N phase clock signals depending on a select signal indicative of which of the N phase clock signals should be selected, wherein the N phase clock signals are identical in frequency with a burst data signal and sequentially shifted in phase by 360 degrees/N;

sampling the burst data signal depending on the N phase clock signals to produce N phase sampled data signals;

rearranging the N phase sampled data signals in synchronization with a selected clock signal to produce N phase rearranged data signals;

detecting falling-edge position information and rising-edge position information based on the N phase sampled data signals;

calculating a falling-edge mean value of the falling-edge position information and a rising-edge mean value of the rising-edge position information for the N phase sampled data signals in synchronization with the selected signal;

generating the select signal from the falling-edge mean value;

detecting duty information based on the N phase sampled data signals in synchronization with the selected signal;

selecting an optimal sampled data signal from the N phase sampled data signals depending on the rising-edge mean value and the duty information; and retiming the sampled data signal selected in synchronization with the selected signal.

* * * * *

UNITED STATES PATENT AND TRADEMARK OFFICE
CERTIFICATE OF CORRECTION

PATENT NO.  : 6,236,696 B1  
DATED       : May 22, 2001  
INVENTOR(S) : Y. Aoki et al.

It is certified that error appears in the above-identified patent and that said Letters Patent is hereby corrected as shown below:

Column 1,  
Line 22, "inventors, Invented" should read -- inventors, invented --  
Line 29, "direction of (received) time." should read -- direction of (received over) time --  
Line 45, "Invention" should read -- invention --

Column 2,  
Line 41, "FIGS. 15A-16F" should read -- FIGS. 16A-16F --  
Line 42, "In" should read -- in --

Column 3,  
Line 1, "FIGS. 27A-27G" should read -- FIGS. 27A-27F --

Column 7,  
Line 37, "Information" should read -- information --

Column 8,  
Line 30, insert -- OPERATION --

Column 9,  
Line 26, "5504" should read -- S504 --

Column 14,  
Line 3, "Information" should read -- information --  
Line 56, "In" should read -- in --

Signed and Sealed this

Tenth Day of September, 2002

Attest:

JAMES E. ROGAN  
*Attesting Officer*  *Director of the United States Patent and Trademark Office*